United States Patent
Yamauchi et al.

(10) Patent No.: US 8,091,682 B2
(45) Date of Patent: Jan. 10, 2012

(54) SOUND ABSORBING SYSTEM FOR ELECTRONIC DEVICE

(75) Inventors: Genta Yamauchi, Mito (JP); Naoki Wada, Odawara (JP); Masanori Watanabe, Hitachinaka (JP); Yosuke Tanabe, Hitachinaka (JP); Kouichirou Kinoshita, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/730,454

(22) Filed: Mar. 24, 2010

(65) Prior Publication Data
US 2010/0307862 A1    Dec. 9, 2010

(30) Foreign Application Priority Data

Jun. 8, 2009 (JP) .................................. 2009-137191
Mar. 15, 2010 (JP) .................................. 2010-057607

(51) Int. Cl.
G10K 11/04    (2006.01)
(52) U.S. Cl. ........................................ 181/224; 181/225
(58) Field of Classification Search .................. 181/224, 181/225
See application file for complete search history.

(56) References Cited

U.S. PATENT DOCUMENTS

| | | | | |
|---|---|---|---|---|
| 5,332,872 A | * | 7/1994 | Ewanek | 181/224 |
| 6,104,608 A | * | 8/2000 | Casinelli et al. | 361/692 |
| 6,481,527 B1 | * | 11/2002 | French et al. | 181/201 |
| 6,643,130 B1 | * | 11/2003 | DeMarchis et al. | 361/695 |
| 7,238,104 B1 | * | 7/2007 | Greenslade et al. | 454/184 |
| 7,379,299 B2 | * | 5/2008 | Walsh et al. | 361/695 |
| 2007/0139882 A1 | * | 6/2007 | Bartell et al. | 361/695 |
| 2008/0230305 A1 | * | 9/2008 | Goto et al. | 181/224 |

FOREIGN PATENT DOCUMENTS

| | | |
|---|---|---|
| JP | 2005-226639 | 8/2005 |
| JP | 2006-156533 | 6/2006 |
| JP | 2008-028085 | 2/2008 |
| JP | 2008-235381 | 10/2008 |

OTHER PUBLICATIONS

U.S. Appl. No. 12/536,598, filed Jun. 30, 2011, Tanabe.

\* cited by examiner

*Primary Examiner* — Jeremy Luks
(74) *Attorney, Agent, or Firm* — Antonelli, Terry, Stout & Kraus, LLP.

(57) ABSTRACT

Disclosed herein is a sound absorbing system used for an electronic device that has enhanced noise reduction capabilities, while maintaining the cooling performance of the device and without increasing the size of the device. A disk array has multiple fans installed on each of the right and left sides of its front section. A frame that houses a sound absorbing system is placed in the middle of an airflow path through which air passes from the fans. Two sound absorbers are arranged inside the frame such that each of the sound absorbers faces the right-side or left-side fans. Airflow paths through which air passes from the fans are located in the space between the two sound absorbers. The airflow paths are partitioned by an acoustic board such that each of the airflow paths does not have parallel side faces. The frame, the sound absorbers, the acoustic board, and the airflow paths constitute the sound absorbing system. The sound absorbers and the acoustic board are made of sound absorbing materials such as glass wool, urethane foam, and the like. The sound absorbers and the acoustic board are arranged such that they prevent the fans from being seen from the outside of the sound absorbing system.

4 Claims, 22 Drawing Sheets

SOUND ABSORBING SYSTEM FOR ELECTRONIC DEVICE

BACKGROUND OF THE INVENTION

1. Field of the Invention

The present invention relates to a sound absorbing system for an electronic device such as a disk array or the like.

2. Description of the Related Art

Recent improvements on semiconductors, epitomized by CPUs or information processors used in information technology devices, have led to larger-scale integration of semiconductors inside an information technology device and an increased amount of heat generated therein. Accompanying with that, more cooling fans need to be installed and/or a cooling fan needs to be rotated more. This tends to increase noise from the device.

Further, with recent price decreases and capacity increases of hard disk drives (i.e., information recording devices), information technology devices once typically used by large businesses are now more frequently used by small businesses or end users. Therefore, the demand for noise reduction for such devices is getting greater.

Conventional noise reduction methods include reducing the rotational speeds of fans located inside the housing of an electronic device and placing a sound absorbing structure using a sound absorbing material near the fans or on the cabinet that houses the electronic device provided outside the housing.

For example, when a sound absorbing structure is installed in a disk array that has multiple fans arranged at a front or back section of its housing, multiple sound absorbers that constitute the sound absorbing structure are usually arranged at particular intervals so that airflow paths through which air passes from the fans are each formed between two of the sound absorbers. The noise of the disk array is reduced by sounds radiated from the fans colliding with and being absorbed by the sound absorbers.

Such a noise reduction method is disclosed in JP-2006-156533-A.

SUMMARY OF THE INVENTION

In a conventional sound absorbing system for an electronic device such as a disk array or the like, however, fans can usually be seen directly from the outside of the device through airflow paths. Thus, some of the sounds radiated from the fans become direct sounds that are directly discharged from the device through the airflow paths without being absorbed by the sound absorbing system, and the noise of the device cannot be reduced effectively.

In addition, when the side surfaces of each of the airflow paths are parallel, standing sound waves are likely to be excited within the internal spaces of the airflow paths, resulting in amplification of a sound of a particular frequency.

If adequate sound absorbing capabilities are to be secured for the conventional sound absorbing system, the airflow paths may need to be narrowed so that the amount of sounds radiated outward can be reduced. In that case, however, increasing of the pressure loss of the air discharged from the fans may occur, resulting in a decrease in the cooling performance of the device.

Securing adequate sound absorbing capabilities while maintaining the cooling performance of such a device as a disk array or the like has conventionally required larger sound absorption areas of sound absorbers and longer airflow paths. This method, however, has also drawbacks in that the volume of a sound absorbing system may be increased, which increases the size of an electronic device.

An object of the invention is thus to provide a sound absorbing system used for an electronic device that has enhanced noise reduction capabilities, while maintaining the cooling performance of the device and without increasing the size of the device.

To achieve the above object, the invention is configured as below.

The invention is a sound absorbing system for an electronic device. The device has a housing that houses a recording medium and at least one fan to cool the recording medium and has a ventilation hole through which air discharged or drawn in by the at least one fan passes. The sound absorbing system comprises: a sound absorber arranged so as to face the ventilation hole; an airflow path formed in the sound absorber, the airflow path having an opening through which air discharged from the ventilation hole or air drawn in toward the ventilation hole passes; and an acoustic board arranged in the airflow path, the acoustic board being arranged in a slanted manner with respect to the inner side faces of the airflow path or having curved surfaces, the airflow path is formed such that a straight line that passes through the airflow path from the opening of the airflow path toward the housing does not pass through the ventilation hole but is intercepted by a portion of the housing.

In accordance with the invention, it is possible to provide a sound absorbing system used for an electronic device that has enhanced noise reduction capabilities, while maintaining the cooling performance of the device and without increasing the size of the device.

DESCRIPTION OF THE PREFERRED EMBODIMENTS

Embodiments of the present invention will now be described with reference to the accompanying drawings.

Embodiment 1

Figure 1:
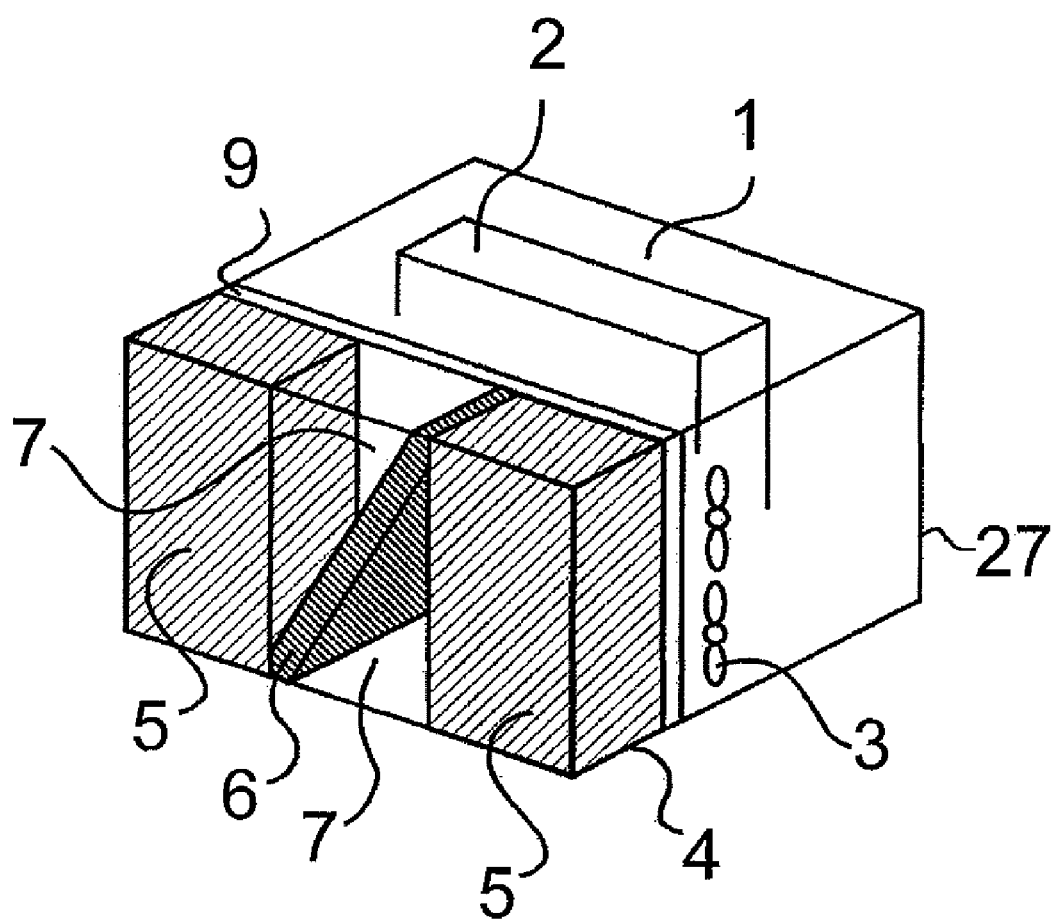
FIG. 1 is a perspective view illustrating the configuration of Embodiment 1 of the invention.
Figure 2:
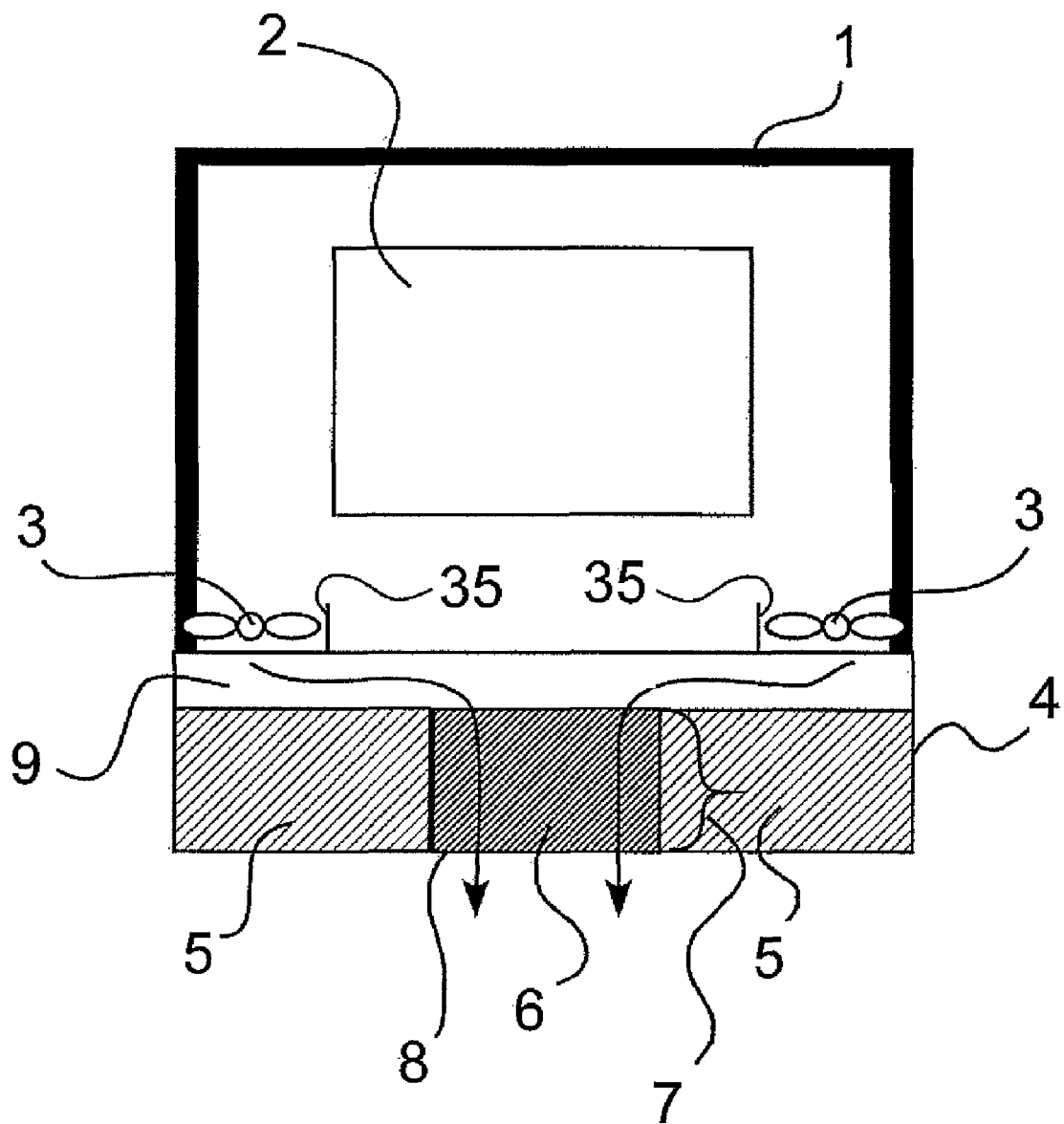
FIG. 2 is a cross-sectional top view of FIG. 1.

FIG. 1 is a perspective view illustrating the configuration of Embodiment 1 of the invention, and FIG. 2 is its cross-sectional top view. Embodiment 1 is an example in which the invention is applied to a disk array.

As illustrated in the figures, a disk array 1 has a recording medium 2 installed inside a housing 27 and has multiple fans 3 installed on each of the right and left sides of a front section of the housing 27 (the "front" section is on the bottom side of FIG. 2). The fans 3 are intended to cool the recording medium 2 and can instead be installed on the right and left sides of a rear section of the housing 27 (the "rear" section is on the top side of FIG. 2). The disk array 1 also has air inlet ports (not illustrated) and air outlet ports 35 as airflow paths through which air passes. The inside of the housing 27 is cooled by the fans 3 discharging the air inside the housing 27 through the air outlet ports 35 and introducing external air through the air inlet ports. Attached to the housing 27 is a frame 4 that houses a sound absorbing system of Embodiment 1 so that the system is located in the middle of an airflow path through which air passes from the air outlet ports 35 of the fans 3.

Two sound absorbers 5 are arranged inside the frame 4 such that each of the sound absorbers 5 faces one of the air outlet ports 35 of the fans 3. As illustrated in FIG. 1, airflow paths 7 through which air passes from the fans 3 are located in the space between the two sound absorbers 5. Each of the airflow paths 7 formed between the two sound absorbers 5 has, as illustrated in FIG. 2, an opening 8 that communicates with the outside of the frame 4.

As illustrated in FIG. 1, the airflow paths 7 are partitioned by an acoustic board (sound absorbing material) 6 such that each of the airflow paths 7 does not have parallel side faces. In the example of FIG. 1, the acoustic board 6 is slanted with respect to the side faces of the sound absorbers 5 that constitute the perpendicular side faces of the airflow paths 7. Hence, the two airflow paths 7 are right-triangle-shaped when viewed from the front side of the disk array 1.

The sound absorbers 5 and the acoustic board 6 are arranged with a space 9 provided between those and the housing 27. The space 9 is formed by the frame of the housing 27 being connected to the frame 4 or the frame 4 being connected to the front section of the housing 27. It thus follows that the space 9 is located between the sound absorbers 5 and the face of the housing 27 through which the air outlet ports 35 are formed. The space 9 communicates with the airflow paths 7 so that air discharged through the air outlet ports 35 is directed through the space 9 and the opening 8 into the outside.

The frame 4, the sound absorbers 5, the acoustic board 6, and the airflow paths 7 constitute the sound absorbing system of Embodiment 1. The sound absorbers 5 and the acoustic board 6 are made of sound absorbing materials such as glass wool, urethane foam, and the like. Such materials are applicable as all or part of the materials of the sound absorbers 5 and the acoustic board 6, by selecting the best-suited sound absorbing materials for the noise generated by the disk array 1.

The sound absorbers 5 and the acoustic board 6 are installed at positions that prevent the fans 3 from being seen from the outside of the sound absorbing system.

Those installation positions are further discussed with reference to FIG. 3. Assume that Point a is located at the space-9-side end of the side of a sound absorber 5a that constitutes the perpendicular side face of one of the airflow paths 7 and that Point b is located at the opening-8-side end of the side of a sound absorber 5b that constitutes the perpendicular side face of the other airflow path 7. Further assume that Line L1 passes through Points a and b. Then, it follows that the positional relationships among the fans 3 (3a and 3b in FIG. 3), the sound absorbers 5 (5a and 5b), and the airflow paths 7 are such that Line L1 does not pass through the opening for the left-side fan 3a (i.e., the left-side air outlet port 35) but through the airflow paths 7. Likewise, assume that Point c is located at the space-9-side end of the side of the sound absorber 5b that constitutes the perpendicular side face of one of the airflow paths 7 and that Point d is located at the opening-8-side end of the side of the sound absorber 5a that constitutes the perpendicular side face of the other airflow path 7. Further assume that Line L2 passes through Points c and d. Then, it follows that the positional relationships among the fans 3 (3a and 3b), the sound absorbers 5 (5a and 5b), and the airflow paths 7 are such that Line L2 does not pass through the opening for the right-side fan 3b (i.e., the right-side air outlet port 35) but through the airflow paths 7.

In other words, the positional and dimensional relationships among the fans 3, the sound absorbers 5, and the airflow paths 7 are such that straight lines that pass from the outside of the sound absorbing system through the airflow paths 7 toward the disk array 1 do not pass through the fans 3 arranged inside the disk array 1.

Discussed next are advantages resulting from the configuration of Embodiment 1 of the invention.

As illustrated in FIG. 2, sounds radiated from the fans 3 first collide with the sound absorbers 5, each of which faces one of the fans 3, and are then absorbed partially by the sound absorbers 5. The radiated sounds that have not been absorbed then flow through the space 9 between the sound absorbers 5 and the housing 27 and flow toward the airflow paths 7 formed by the sound absorbers 5 and the acoustic board 6. At the entrance sections of the airflow paths 7, part of the sounds flowing toward the airflow paths 7 is reflected toward the space 9, and the rest flows into and through the airflow paths 7. Thus, the sounds flowing toward the airflow paths 7 are attenuated before flowing into the airflow paths 7.

In other words, the sounds radiated from the fans 3 flow through the airflow paths 7 by repeating collisions with the sound absorbers 5 and the acoustic board 6 and are eventually discharged from the sound absorbing system through the openings 8.

Every time a sound collides with the sound absorbers 5 and the acoustic board 6, the sound is absorbed and attenuated. This contributes to reduction in noise from the disk array 1. Further, since the sound absorbers 5 and the acoustic board 6 are installed at positions that prevent the fans 3 from being seen from the outside of the sound absorbing system, direct sounds from the fans 3 are absent. This also contributes to reduction in noise from the disk array 1.

Furthermore, each of the airflow paths 7 formed by the sound absorbers 5 and the acoustic board 6 does not have parallel side faces, as illustrated in FIG. 1. This helps prevent standing sound waves from being excited within the internal spaces of the airflow paths 7 and a sound of a particular frequency from being amplified.

The multiple fans 3 arranged on each of the right and left sides of the housing 27 may vary in the amount of airflow generated, depending on how the disk array 1 is used or due to a difference in rotational speed therebetween. In such cases, widening the airflow path 7 located closer to the fan 3 that generates a larger amount of airflow helps prevent reduction in the cooling performance of the disk array 1.

Figure 4:
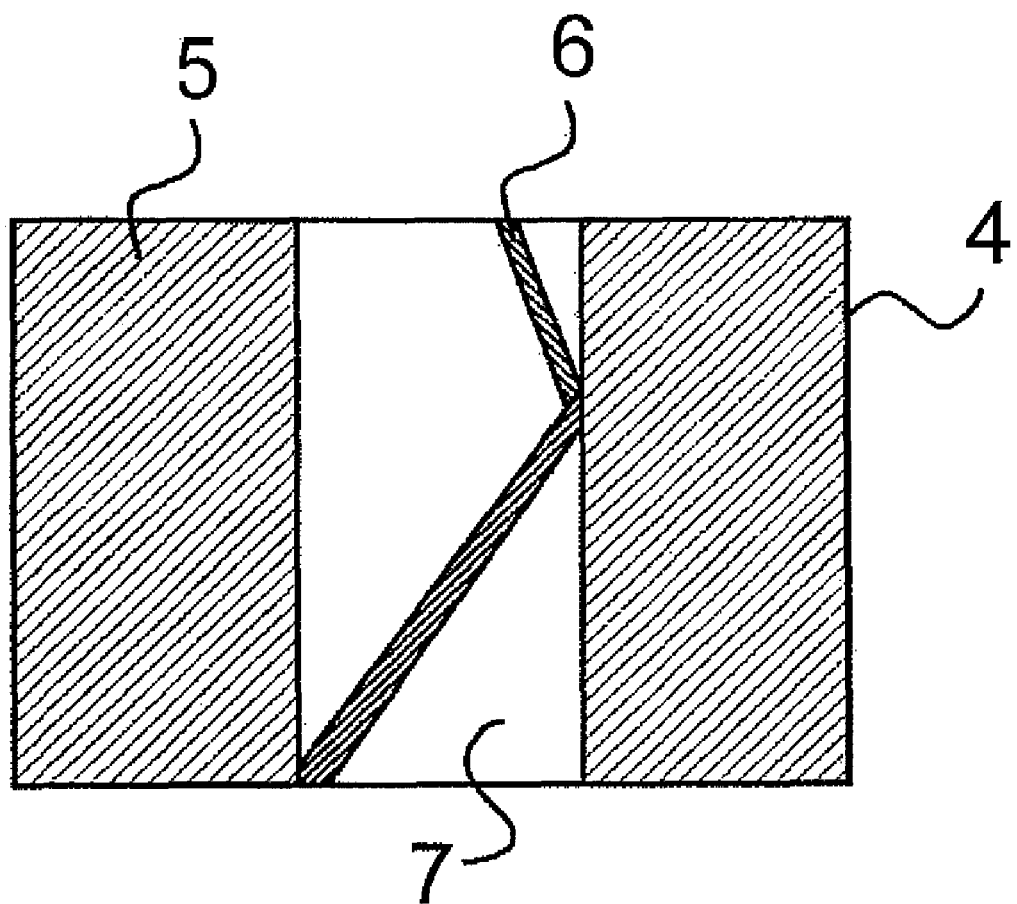
FIG. 4 is a diagram illustrating a modification example of the acoustic board of Embodiment 1.

In the example of FIG. 1, the two airflow paths 7 partitioned by the acoustic board 6 are equal in internal space size. However, the internal space sizes of the two can be changed by adjusting the position, number, or angle of the acoustic board 6. FIG. 4 is one such example and illustrates a front view of a sound absorbing system in which the left-side fan 3 (when viewed from the front side of the disk array 1) generates a larger amount of airflow than the right-side fan 3.

In FIG. 4, the acoustic board 6 is bent, and three airflow paths 7 of uneven internal space sizes are formed.

By thus changing the position, number, or angle of the acoustic board 6 according to the right- and left-side airflow amounts, the cooling performance of the disk array 1 can be maintained.

Still another advantage of Embodiment 1 is that a thinner sound absorbing system is possible while the cooling performance of the disk array 1 is maintained. The reason is that the airflow paths 7 can be shortened and widened compared with their counterparts of a conventional sound absorbing structure.

The sound absorbing system of Embodiment 1 of the invention is secured to the disk array 1 with hinges. Specifically, the hinges are attached between the frame 4 and the housing 27, and the sound absorbing system pivots on the hinges like a door.

Thus, when the sound absorbing system is in an opened state, it is possible to replace the recording medium 2 inside the disk array 1 with a new one or maintain the inside of the disk array 1.

The frame 4 is made up of a hard material such as a plate, a board, and the like. The frame 4 covers the sound absorbers 5 and the acoustic board 6, but not the airflow paths 7, so that the sound absorbers 5 and the acoustic board 6 cannot be directly touched from the outside of the sound absorbing system.

Embodiment 2

Figure 5:
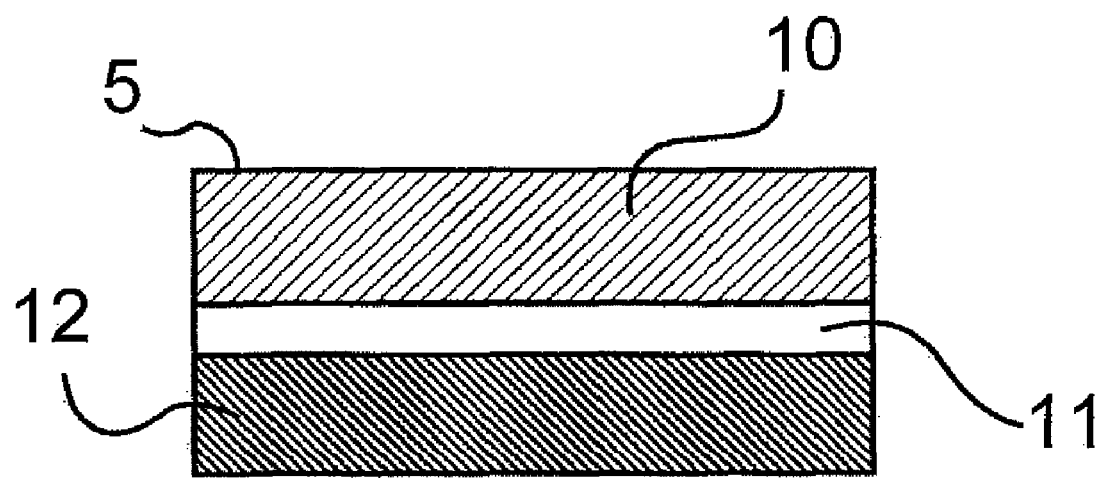
FIG. 5 is a diagram illustrating Embodiment 2 of the invention.

The essential part of Embodiment 2 of the invention is illustrated in FIG. 5. FIG. 5 is a cross-sectional top view of one of the sound absorbers 5 that each have a laminate structure including sound absorbing materials 10, 11 and 12 such as glass wool, urethane foam, and the like. The other structures of Embodiment 2 are the same as those of Embodiment 1 and will not be discussed further.

By stacking together the sound absorbing materials 10 to 12 of different sound absorption characteristics as in Embodiment 2, the sound absorption characteristics of the entire sound absorbers 5 can be changed as desired. In other words, by selecting the best-suited sound absorbing materials for the noise of the disk array 1 that changes according to the rotational speeds of the fans 3 and stacking them together with the best possible combination, the noise can be reduced effectively.

Likewise, the acoustic board 6 can also be made by stacking multiple sound absorbing materials together.

Figure 6:
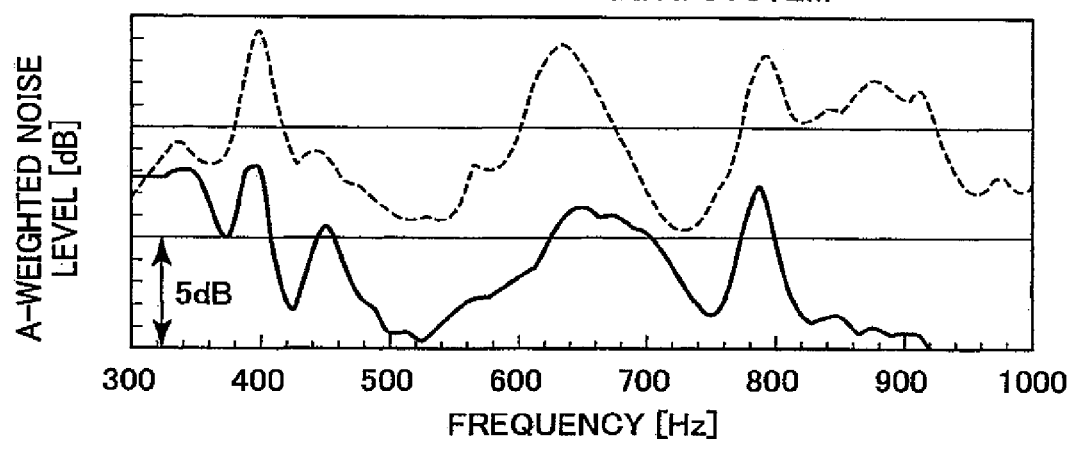
FIG. 6 is a graph showing measured noise levels of a disk array to which a sound absorbing system is applied in accordance with Embodiments 1 and 2.

FIG. 6 is a graph showing measured noise levels of a disk array to which a sound absorbing system is applied in accordance with Embodiments 1 and 2.

In FIG. 6, the horizontal axis represents the frequency of noise, and the vertical axis represents A-weighted noise levels. The measurement was done at a location 1 meter away from the front of the disk array. The dashed line of FIG. 6 represents noise levels obtained when the disk array 1 is without the sound absorbing system, and the solid line represents noise levels obtained when the sound absorbing system is installed on the air discharge side of the disk array 1 as in Embodiment 1. FIG. 6 reveals that in the entire frequency range, the noise levels indicated by the solid line are smaller than those indicated by the dashed line.

Embodiment 3

Figure 7:
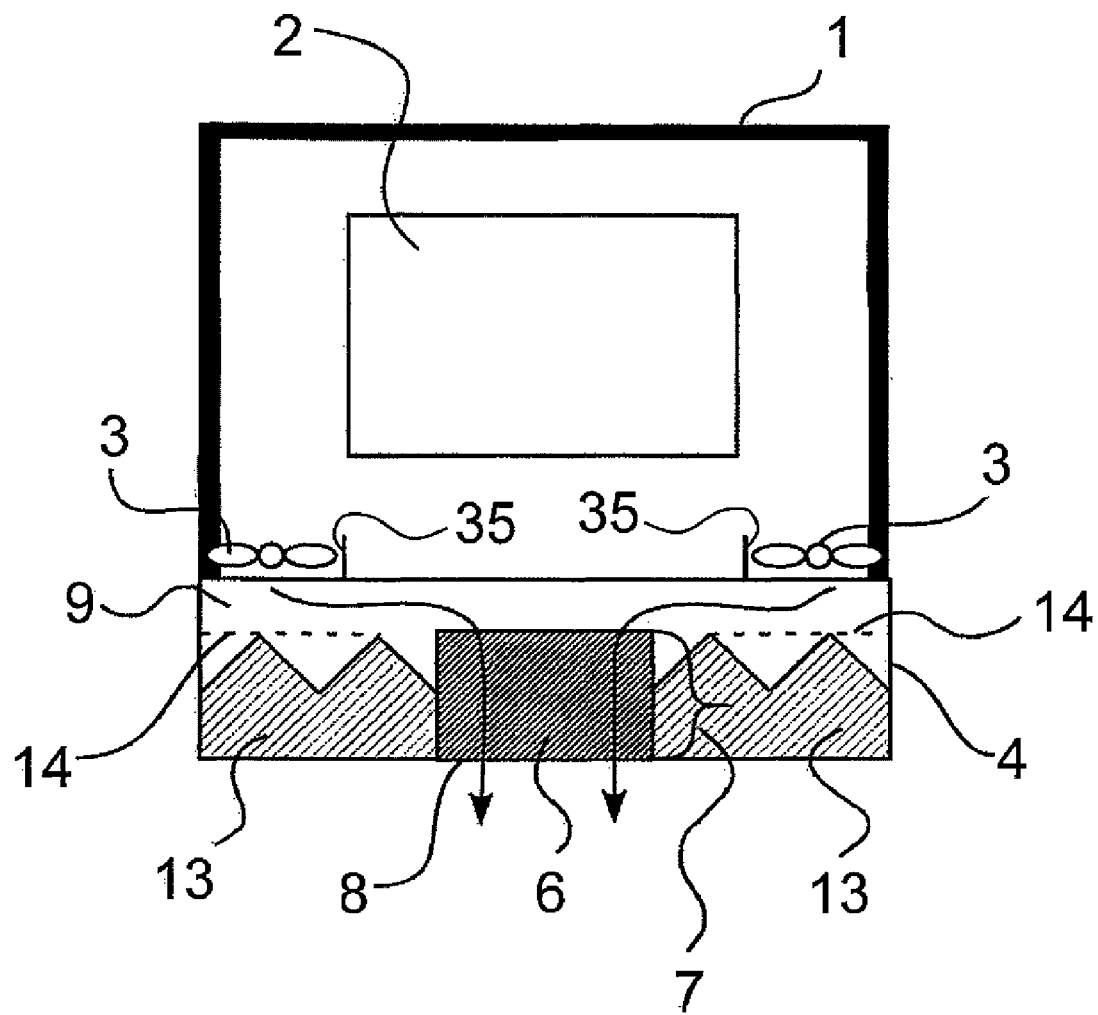
FIG. 7 is a cross-sectional top view of the configuration of Embodiment 3 of the invention.

FIG. 7 is a cross-sectional top view of the configuration of Embodiment 3 of the invention. In Embodiment 3, the disk array 1 is provided with two sound absorbers 13 in place of the two sound absorbers 5 of Embodiment 1. The sound absorbers 13 are made by forming multiple concave and convex portions on the surfaces of the sound absorbers 5 that face the fans 3.

The above zigzag-shaped structures of the sound absorbers 13 result in larger sound absorption areas and contribute to a further reduction in the noise of disk array 1.

The other structures of Embodiment 3 are the same as those of Embodiment 1 and will not be discussed further.

It is desired that the concave and convex portions of each of the sound absorbers 13 be covered with a mesh-like cloth 14 so that the user cannot touch those portions directly and can avoid injury. In that case, because sounds are allowed to pass through the cloths 14, the sound absorption areas of the sound absorbers 13 remain unchanged (i.e., remain larger).

Embodiment 4

Figure 8:
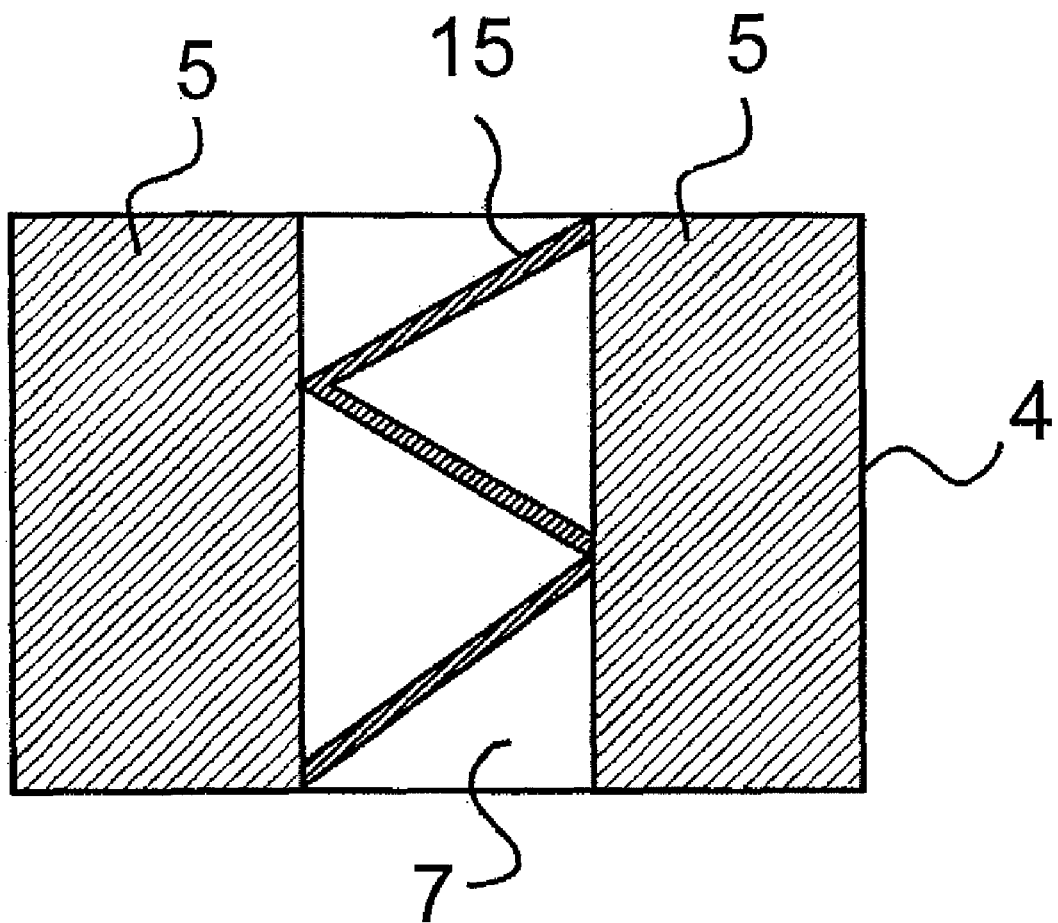
FIG. 8 is a diagram illustrating Embodiment 4 of the invention.

FIG. 8 is a front view of a sound absorbing system according to Embodiment 4 of the invention. In Embodiment 4, the sound absorbing system is provided with an acoustic board 15 in place of the acoustic board 6 of Embodiment 1. The acoustic board 15 is made by bending the acoustic board 6 at two positions so that four triangular airflow paths 7 (when viewed from the front side of the sound absorbing system) are formed, surrounded by the side faces of the sound absorbers 5 and the frame 4.

The other structures of Embodiment 4 are the same as those of Embodiment 1 and will not be discussed further.

The above structure of the acoustic board 15 allows more of the sounds radiated from the fans 3 to collide with and be absorbed by the sound absorbers 5 and the acoustic board 15 than in Embodiment 1. It also helps prevent standing sound waves from being excited within the internal spaces of the airflow paths 7 and a sound of a particular frequency from being amplified because each of the airflow paths 7 does not have parallel side faces.

Embodiment 5

Figure 9:
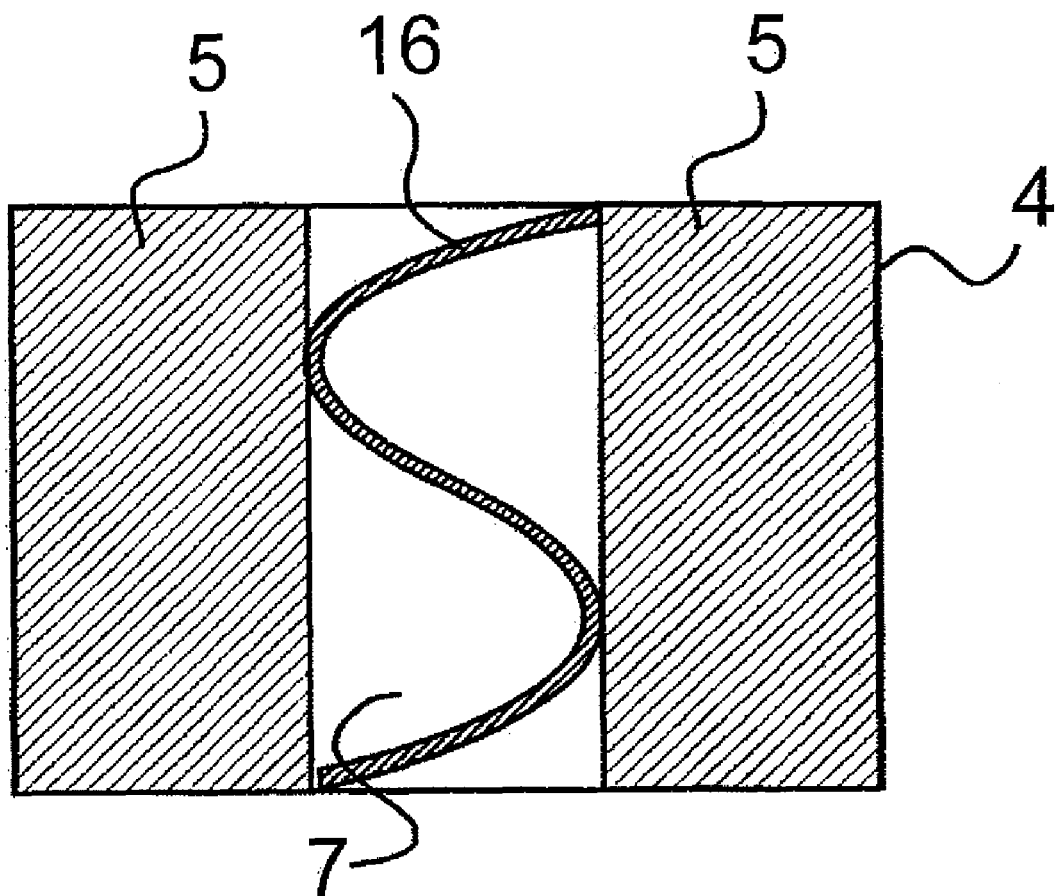
FIG. 9 is a diagram illustrating Embodiment 5 of the invention.

FIG. 9 is a front view of a sound absorbing system according to Embodiment 5 of the invention. In Embodiment 5, the sound absorbing system is provided with an acoustic board 16 in place of the acoustic board 6 of Embodiment 1. The acoustic board 16 is wave-shaped when viewed from the front of the sound absorbing system.

The other structures of Embodiment 5 are the same as those of Embodiment 1 and will not be discussed further.

The above structure of the acoustic board 16 allows more of the sounds radiated from the fans 3 to collide with and be absorbed by the sound absorbers 5 and the acoustic board 16 than in Embodiment 1. It also helps prevent standing sound waves from being excited within the internal spaces of the airflow paths 7 and a sound of a particular frequency from being amplified because each of the airflow paths 7 does not have parallel side faces.

Embodiment 6

Figure 10:
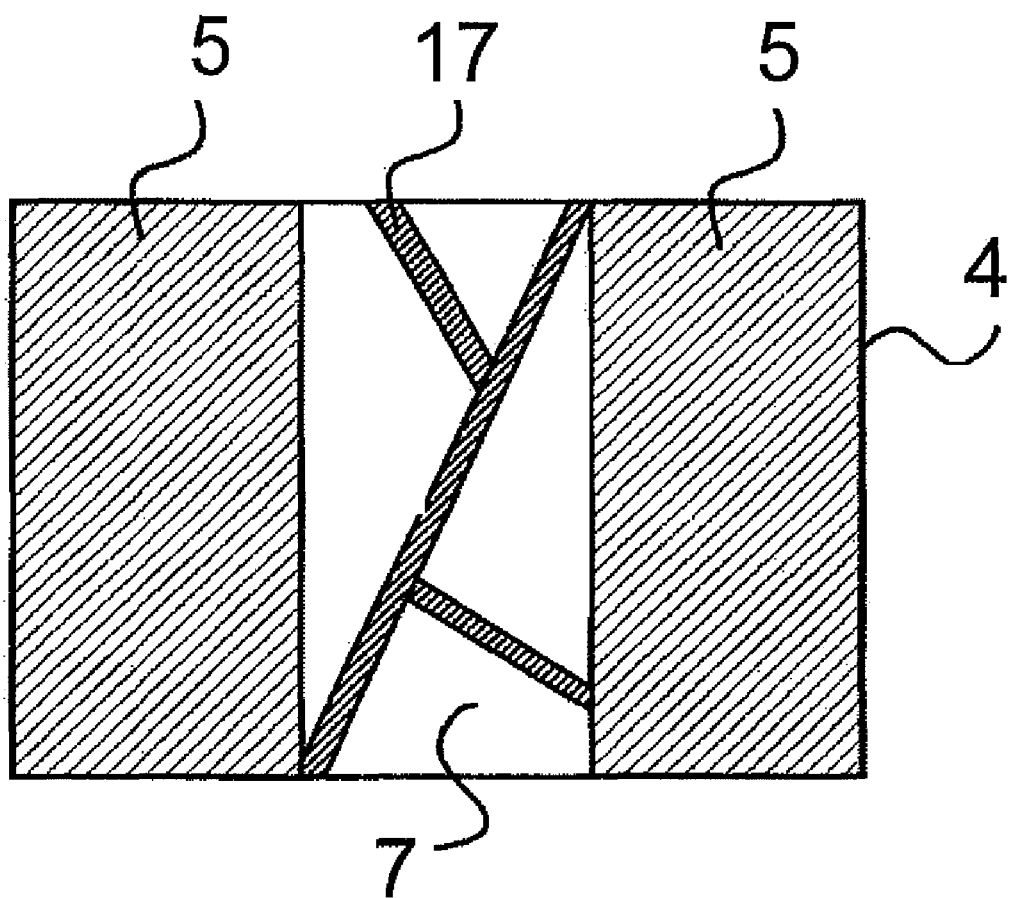
FIG. 10 is a diagram illustrating Embodiment 6 of the invention.

FIG. 10 is a front view of a sound absorbing system according to Embodiment 6 of the invention. In Embodiment 6, the sound absorbing system is provided with an acoustic board 17 in place of the acoustic board 6 of Embodiment 1. The acoustic board 17 has two branches when viewed from the front of the sound absorbing system. In other words, the acoustic board 17 is made up of a board (i.e., the acoustic board 6) and the two other branching boards.

The other structures of Embodiment 6 are the same as those of Embodiment 1 and will not be discussed further.

The above structure of the acoustic board 17 allows more of the sounds radiated from the fans 3 to collide with and be absorbed by the sound absorbers 5 and the acoustic board 17 than in Embodiment 1. It also helps prevent standing sound waves from being excited within the internal spaces of the airflow paths 7 and a sound of a particular frequency from being amplified because each of the airflow paths 7 does not have parallel side faces.

Embodiment 7

Figure 11:
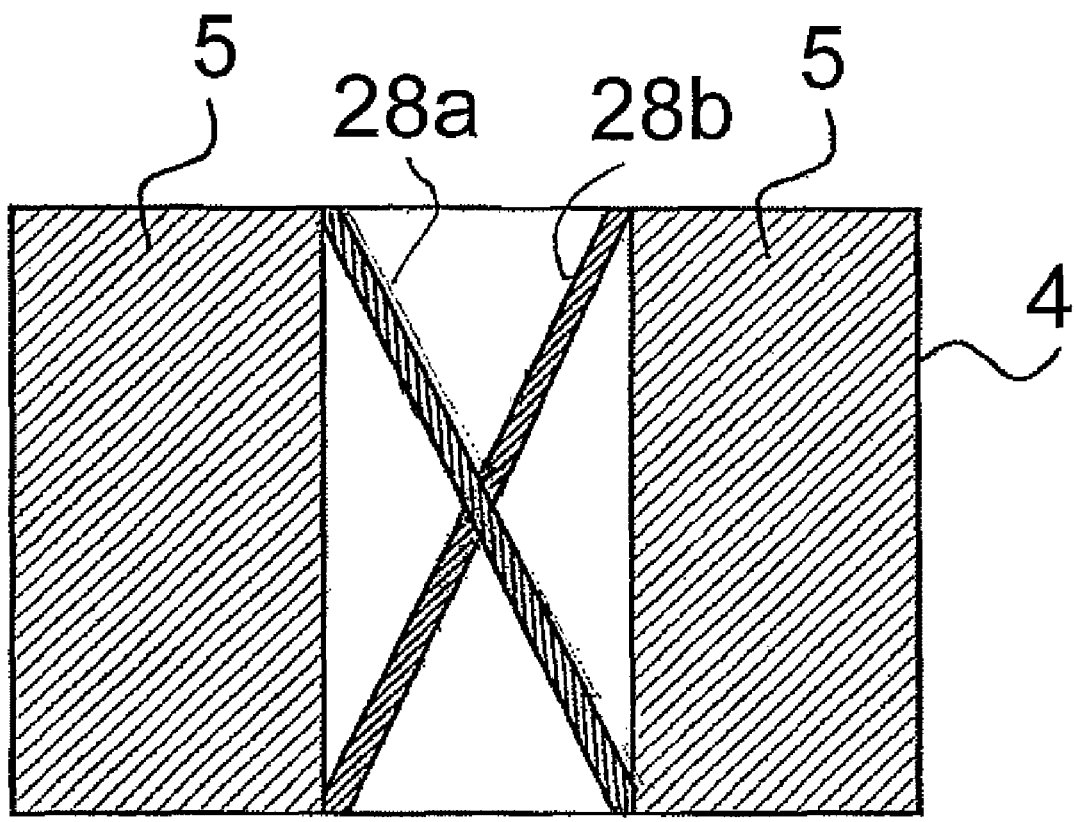
FIG. 11 is a diagram illustrating Embodiment 7 of the invention.

FIG. 11 is a front view of a sound absorbing system according to Embodiment 7 of the invention. In Embodiment 7, the sound absorbing system is provided with acoustic boards 28a and 28b in place of the acoustic board 6 of Embodiment 1. The acoustic boards 28a and 28b cross each other so that they form an X shape when viewed from the front of the sound absorbing system.

The other structures of Embodiment 7 are the same as those of Embodiment 1 and will not be discussed further.

The above structure of the acoustic boards 28a and 28b allows more of the sounds radiated from the fans 3 to collide with and be absorbed by the sound absorbers 5 and the acoustic boards 28a and 28b than in Embodiment 1. It also helps prevent standing sound waves from being excited within the internal spaces of the airflow paths 7 and a sound of a particular frequency from being amplified because each of the airflow paths 7 does not have parallel side faces.

Embodiment 8

Figure 12:
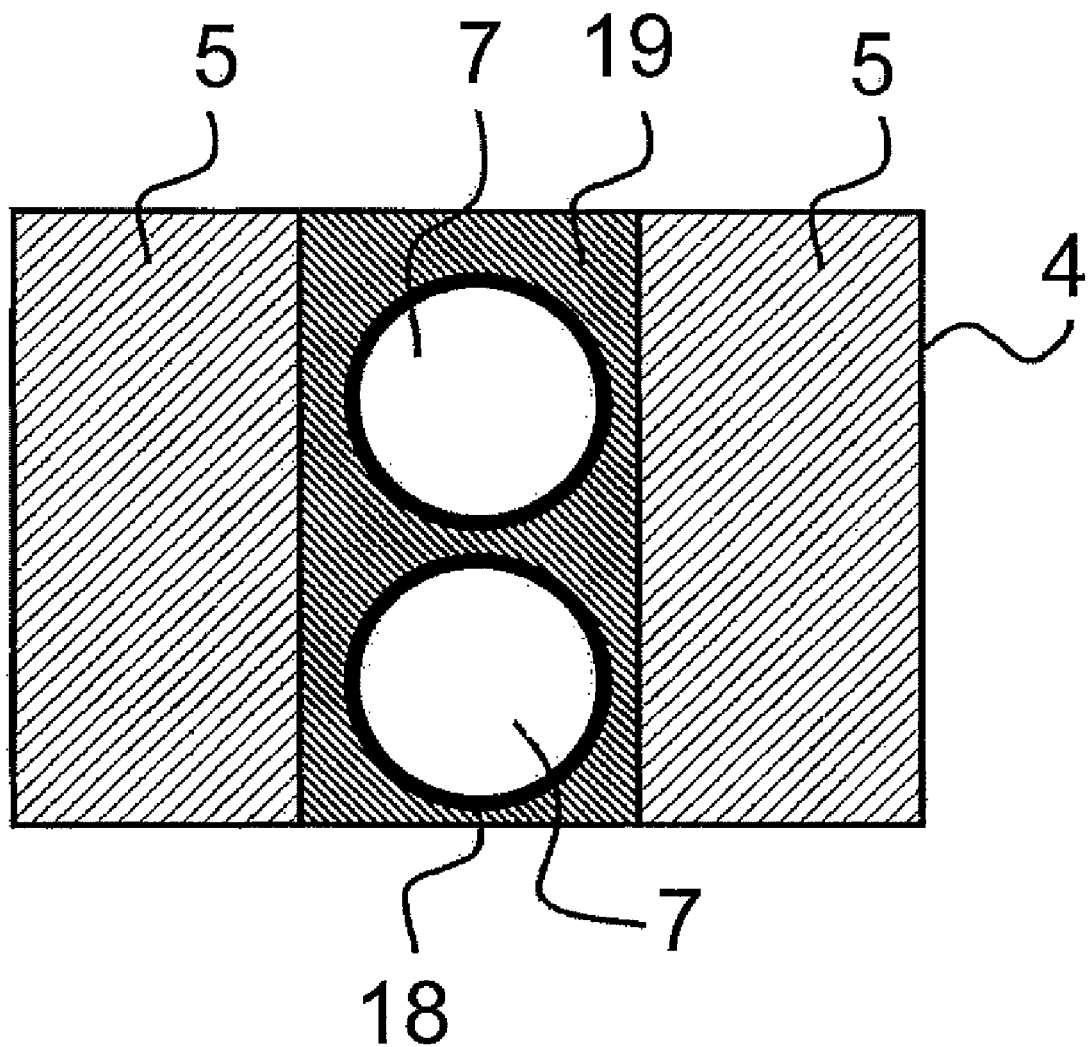
FIG. 12 is a diagram illustrating Embodiment 8 of the invention.

FIG. 12 is a front view of a sound absorbing system according to Embodiment 8 of the invention. In Embodiment 8, the sound absorbing system is provided with a sound absorber 19 in place of the acoustic board 6 of Embodiment 1. The sound absorber 19 has two airflow paths 7 each with a circular opening 18 when viewed from the front of the sound absorbing system. In other words, the airflow paths 7 are circular when viewed from the front of the sound absorbing system.

The other structures of Embodiment 8 are the same as those of Embodiment 1 and will not be discussed further.

As illustrated in FIG. 12, the sound absorber 19 is placed between the space surrounded by the sound absorbers 5 and the frame 4, and the hollow portions of the sound absorber 19 act as the airflow paths 7.

The above structure of the acoustic board 19 allows more of the sounds radiated from the fans 3 to collide with and be absorbed by the sound absorbers 5 and the sound absorber 19 than in Embodiment 1. It also helps prevent standing sound waves from being excited within the internal spaces of the airflow paths 7 and a sound of a particular frequency from being amplified because each of the airflow paths 7 does not have parallel side faces.

The sound absorber 19 can be made by staking together multiple sound absorbing materials as in Embodiment 2.

Embodiment 9

Figure 13:
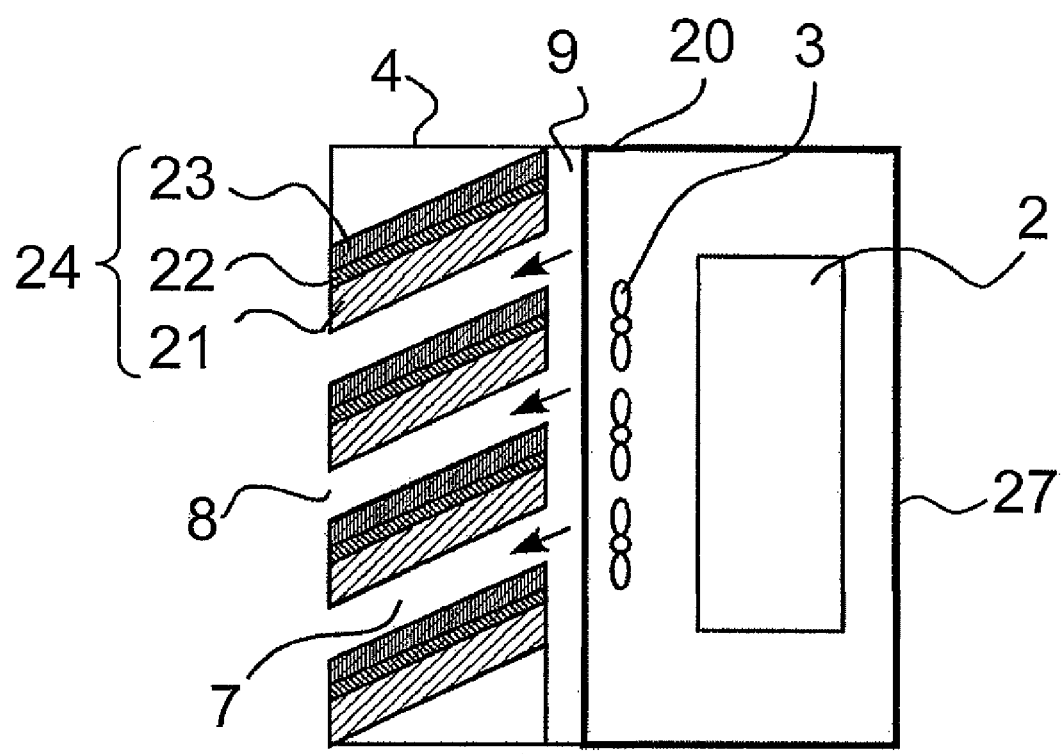
FIG. 13 is a cross-sectional side view illustrating Embodiment 9 of the invention.
Figure 14:
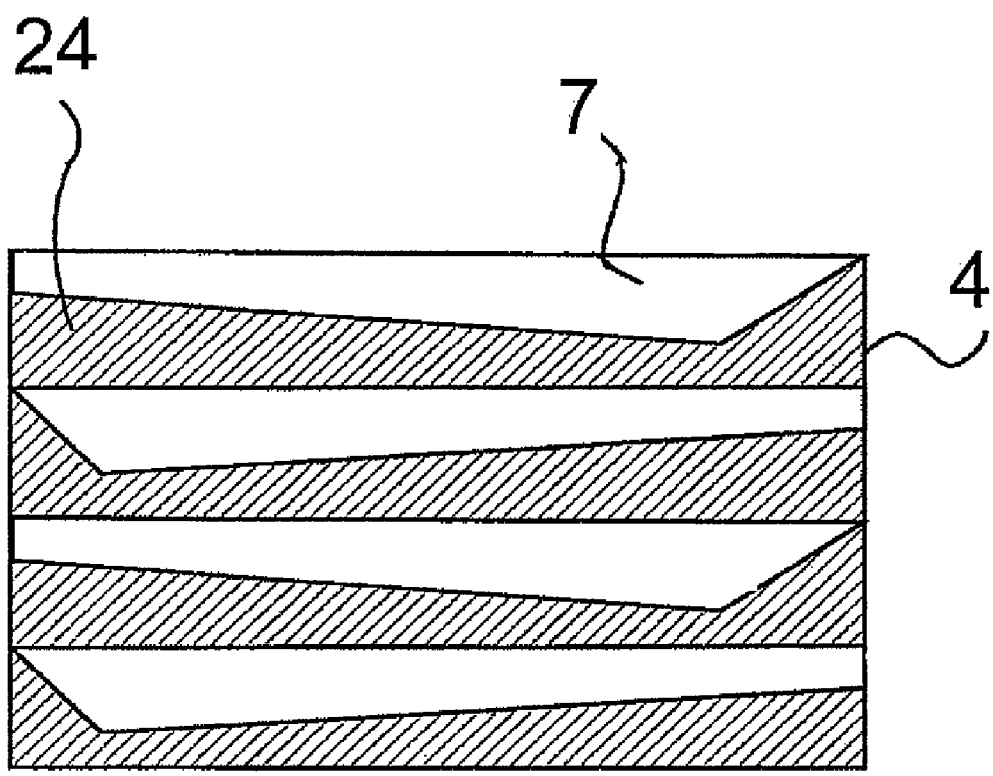
FIG. 14 is a front view illustrating Embodiment 9.

FIG. 13 is a cross-sectional side view of the configuration of Embodiment 9 of the invention, and FIG. 14 is its cross-sectional front view.

As illustrated in FIG. 13, a disk array 20 has the recording medium 2 installed inside its housing 27 and has the fans 3 installed on a front section of the housing 27. The fans 3 are intended to cool the recording medium 2 and can instead be installed on a rear section of the housing 27. The frame 4 houses a sound absorbing system comprising multiple sound absorbers 24. The sound absorbers 24 are arranged inside the frame 4 in a slanted manner such that the sound absorbers 24 prevent the fans 3 from being seen from the outside of the sound absorbing system. The sound absorbers 24 are each made by stacking together sound absorbing materials 21, 22, and 23 such as glass wool, urethane foam, and the like.

As illustrated in FIG. 13, the sound absorbers 24 are arranged at particular intervals so that each space between two of the sound absorbers 24 acts as an airflow path 7 through which air flows from the fans 3. The space 9 is also provided between the sound absorbers 24 and the housing 27. As illustrated in FIG. 14, the side faces of each of the airflow paths 7 are not parallel. The other structures of Embodiment 9 are the same as those of Embodiment 1 and will not be discussed further.

As illustrated in FIG. 13, sounds radiated from the fans 3 first collide with the sound absorbers 24 and are absorbed partially by the sound absorbers 24. The radiated sounds that have not been absorbed then flow through the space 9 between the sound absorbers 24 and the housing 27 and flow toward the airflow paths 7 surrounded by the sound absorbers 24. At the entrance sections of the airflow paths 7, part of the sounds flowing toward the airflow paths 7 is reflected toward the space 9, and the rest flows into and through the airflow paths 7. Thus, the sounds flowing toward the airflow paths 7 are attenuated before flowing into the airflow paths 7.

In other words, the sounds radiated from the fans 3 flow through the airflow paths 7 by repeating collisions with the sound absorbers 24 and are eventually discharged from the sound absorbing system through the openings 8. Because the sounds are absorbed and attenuated every time they collide with the sound absorbers 24, the noise of the disk array 20 can be reduced. Further, since the sound absorbers 24 are installed at positions that prevent the fans 3 from being seen from the outside of the sound absorbing system, direct sounds from the fans 3 are absent. This also contributes to reduction in the noise of the disk array 20.

The noise of the disk array 20 can also be reduced effectively by selecting the best-suited sound absorbing materials for the noise that changes according to the rotational speeds of the fans 3 and stacking them together with the best possible combination, as in Embodiment 2.

Furthermore, the above configuration of Embodiment 9 helps prevent standing sound waves from being excited within the internal spaces of the airflow paths 7 and a sound of a particular frequency from being amplified because each of the airflow paths 7 does not have parallel side faces.

Still another advantage of Embodiment 9 is that a thinner sound absorbing system is possible because the airflow paths 7 can be shortened compared with their counterparts of a conventional sound absorbing structure.

Figure 15:
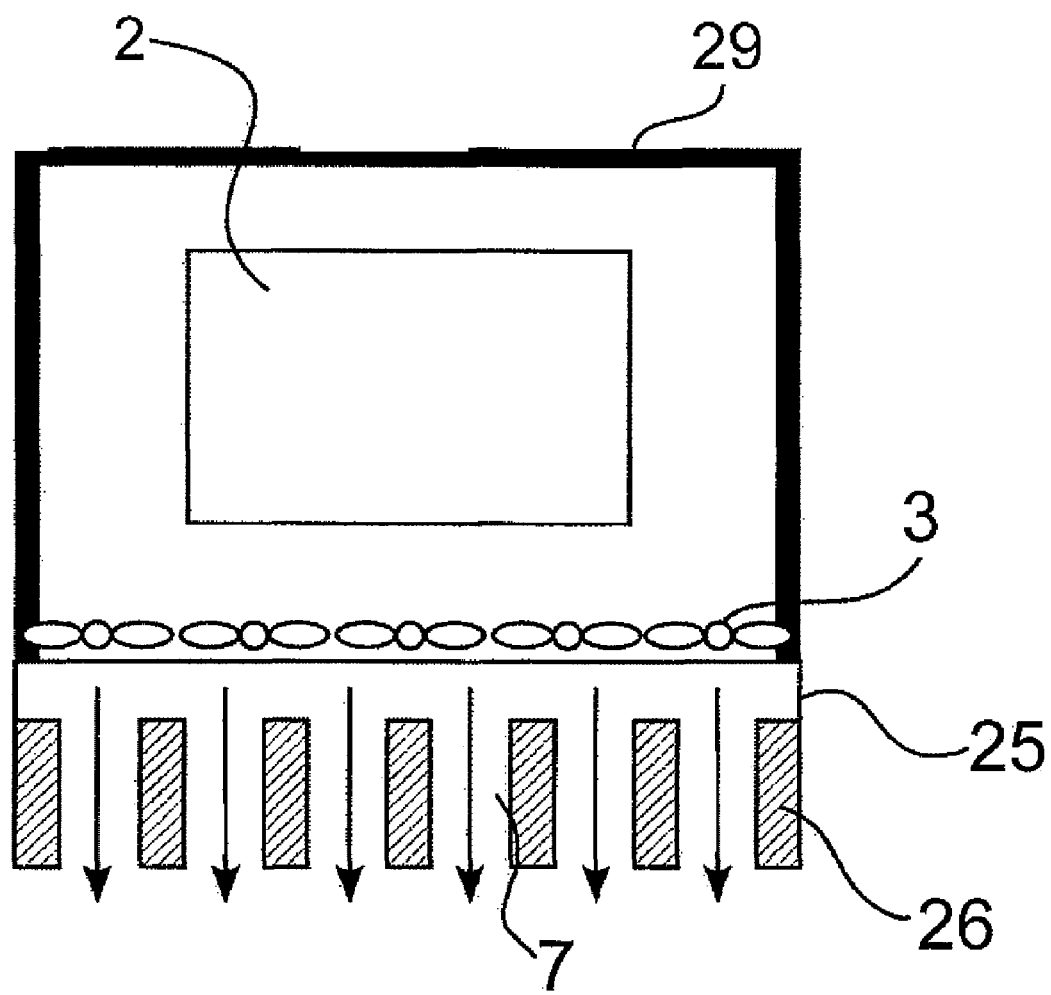
FIG. 15 is a diagram illustrating a comparative example in which the invention is not applied.

FIG. 15 is a diagram showing a comparative example in which the invention is not applied.

In FIG. 15, the fans 3 are installed on the front side of the housing of a disk array 29. The spaces formed between sound absorbers 26 act as the airflow paths 7 though which air flows from the fans 3. In the sound absorbing system 25 of FIG. 15, the noise of the disk array 29 is reduced by the sounds radiated from the fans 3 colliding with and being absorbed by the sound absorbers 26.

In the example of FIG. 15, the fans 3 can be seen directly from the outside of the disk array 29 through the airflow paths 7. Thus, some of the sounds radiated from the fans 3 become direct sounds that are directly discharged from the disk array 29 through the airflow paths 7 without being absorbed by the sound absorbers 26, and the noise of the disk array 29 cannot be reduced effectively.

The configuration of FIG. 15 may also result in standing sound waves inside the airflow paths 7 and amplification of a sound of a particular frequency because the side faces of each of the airflow paths 7 are parallel.

In the sound absorbing system of FIG. 15, adequate sound absorbing capabilities may be secured by narrowing the airflow paths 7 and reducing the amount of sounds radiated outward. In that case, however, the pressure of the air discharged from the fans 3 may be lost, resulting in a decrease in the cooling performance of the disk array 29.

In contrast, a sound absorbing system according to the invention is designed to prevent the fans 3 from being seen from outside. Thus, direct sounds from the fans 3 are absent, and the noise of a disk array 1 can be reduced.

In addition, the sound absorbing system of the invention prevents standing sound waves from being excited within the internal spaces of the airflow paths 7 and a sound of a particular frequency from being amplified because each of the airflow paths 7 does not have parallel side faces.

Further, the sound absorbing system of the invention has wider airflow paths and can thus prevent loss of air discharge pressure and maintain the cooling performance of a disk array. Furthermore, the sound absorbing system of the invention has shorter airflow paths than their counterparts of a conventional sound absorbing system and is thus thinner.

It should be noted that while the embodiments of the invention described thus far are examples in which the invention is applied to sound absorbing systems of disk arrays, the invention can also be applied to sound absorbing systems used for other electronic devices such as servers, memory devices, and the like.

The invention is also applicable when the fans 3 are arranged on either the right or the left side of a front section of the housing 27 while the above-described embodiments illustrate examples in which the fans 3 are arranged on both the right and left sides of the front section of the housing 27.

Figure 3:
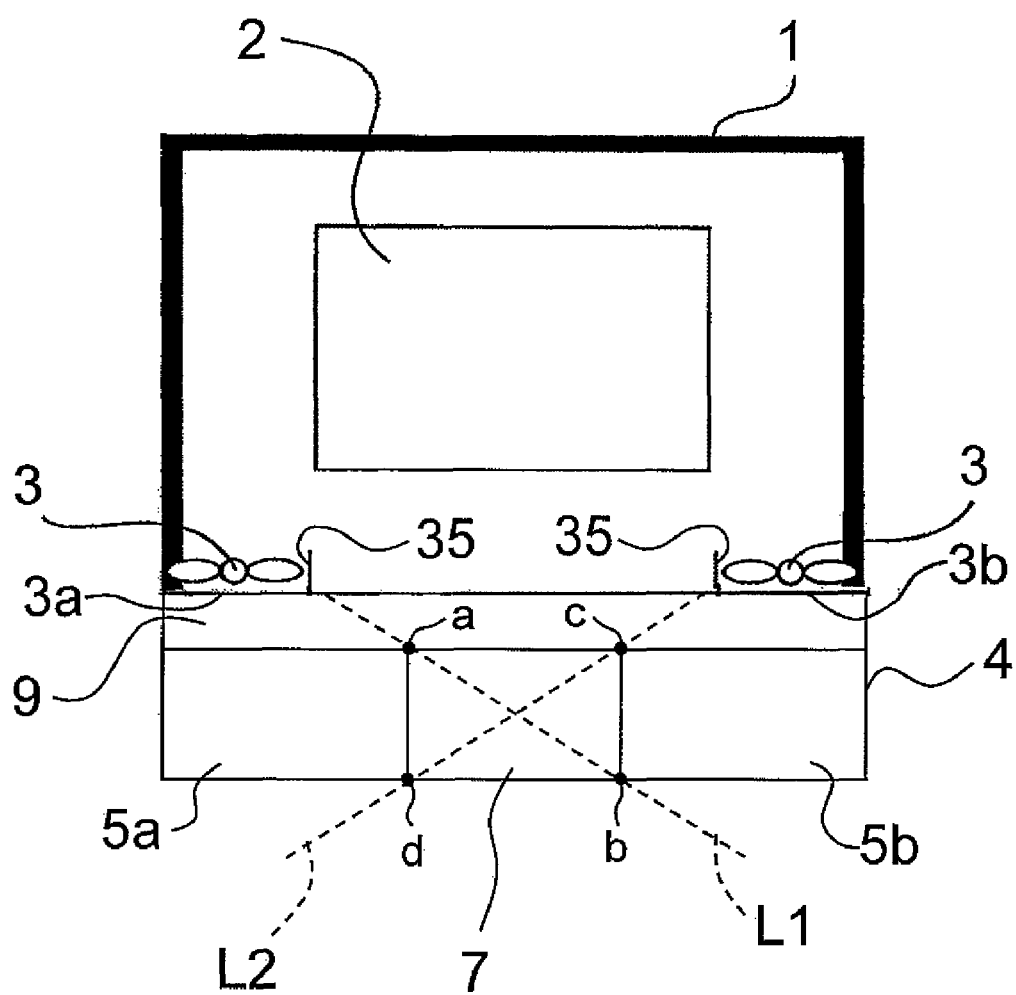
FIG. 3 is a diagram illustrating the positional relationships among the components of Embodiment 1.

In that case, the openings 8 (or 18) need not necessarily be located in the center of the front surface of the sound absorbing system as long as the positional relationships shown in FIG. 3 are maintained.

Further, the above-described embodiments except Embodiment 9 illustrate examples in which the side faces of two sound absorbers 5 that constitute the side faces of the airflow paths 7 are parallel, and standing sound waves are prevented by placing an acoustic board(s) 6 between the two sound absorbers (see FIG. 1, for example). However, those side faces of the two sound absorbers can instead be unparallel.

For instance, one or both of those side faces can have multiple concave and convex portions. Alternatively, they can form in the shape of an inverted V separated at the top when viewed from the front of the sound absorbing system or can be curved faces.

Embodiment 10

Figure 16:
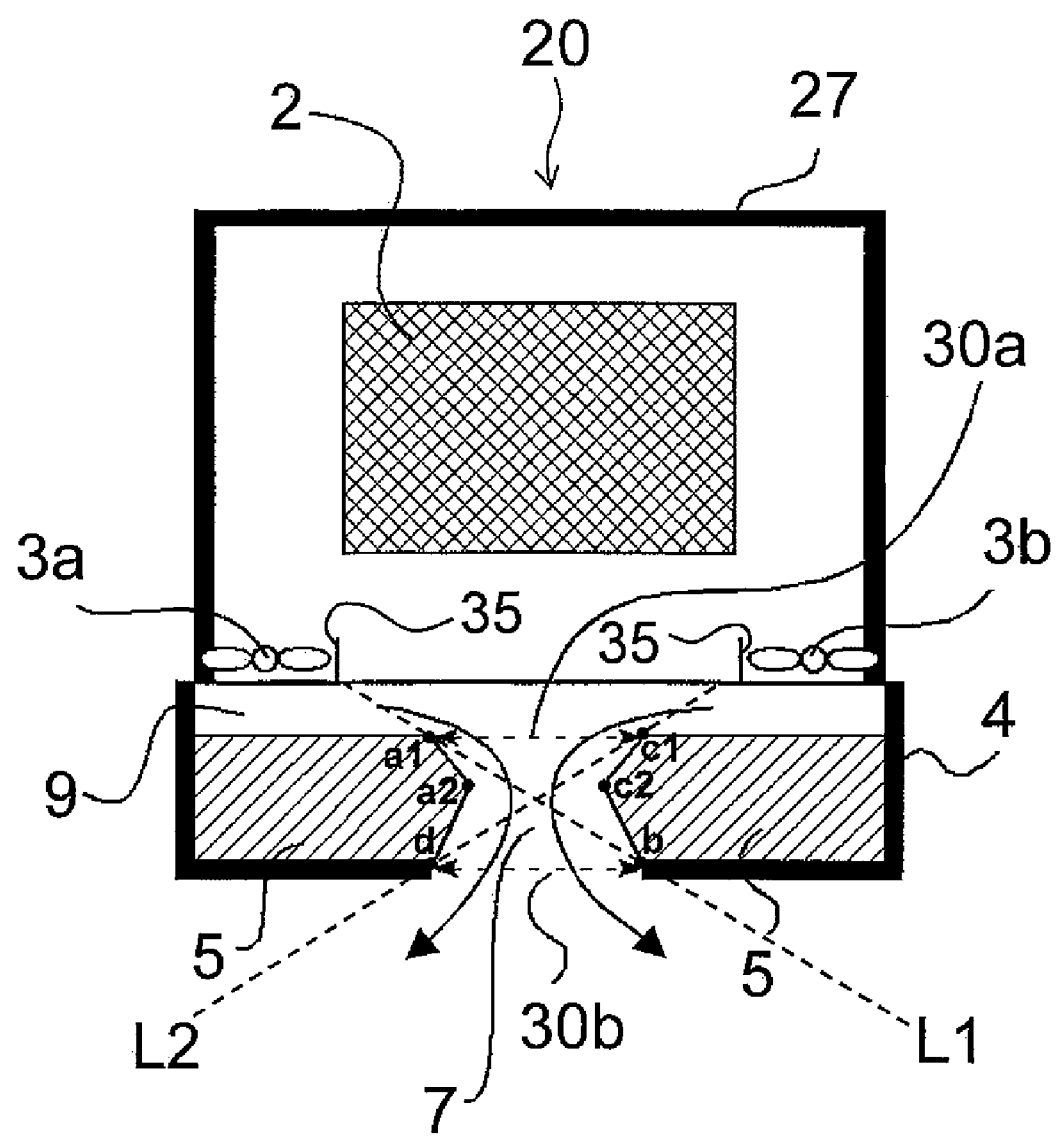
FIG. 16 is a diagram illustrating Embodiment 10 of the invention.

FIG. 16 is a cross-sectional top view illustrating the configuration of Embodiment 10 of the invention. The disk array 20 of FIG. 16 has the recording medium 2 installed inside its housing 27 and has the fans 3a installed on the left side and 3b on the right side of a front section of the housing 27. The fans 3a and 3b are intended to cool the recording medium 2 by discharging the air inside the housing 27 and drawing in external air from air inlet ports not illustrated.

The frame 4 houses a sound absorbing system including two of the sound absorbers 5. The sound absorbers 5 are arranged inside the frame 4 such that the sound absorbers 5 face the air outlet ports 35 of the fans 3a and 3b. The sound absorbers 5 are each made of sound absorbing materials such as glass wool, urethane foam, and the like. In the space between the two sound absorbers 5, an airflow path 7 through which air passes from the fans 3a and 3b is provided. The airflow path 7 communicates with the outside of the sound absorbing system.

As illustrated in the cross-section of FIG. 16, the innermost width 30a and the outermost width 30b of the airflow path 7 are larger than those of its other portions. In other words, the width of airflow path 7 becomes smaller, the smallest, and then larger in a direction from the outside of the frame 4 to the inside of the disk array 20. Thus, the portions of the two sound absorbers 5 that form the airflow path 7 are triangular in horizontal cross-section. The sound absorbers 5 can instead be formed such that the corners of those triangles are rounded or curved. The sound absorbers 5 can be made by stacking multiple sound absorbing materials together as in Embodiment 2.

Similar to Embodiment 1, the sound absorbers 5 are arranged and shaped such that the sound absorbers 5 prevent the fans 3a and 3b from being seen from the outside of the sound absorbing system. To illustrate this, first assume that, as shown in FIG. 16, the vertices of the triangle that appears in a horizontal cross-section of the left-side sound absorber 5 are denoted by Points a1, a2, and d in a direction from the space-9-side to the front of the sound absorbing system and that the vertices of the triangle that appears in a horizontal cross-section of the right-side sound absorber 5 are likewise denoted by Points c1, c2, and b. Further assume that Line L1 passes through Point b and Point a1 (or Point a2) and that Line L2 passes through Point d and Point c1 (or Point c2). Then, it follows that the sound absorbers 5 are arranged such that Line L1 does not pass through the left-side air outlet port 35 but through the airflow path 7 and such that L2 does not pass through the right-side air outlet port 35 but through the airflow path 7.

The frame 4 is made up of a hard material such as a plate, a board, and the like. The frame 4 covers the sound absorbers 5, but not the airflow path 7, so that the sound absorbers 5 cannot be directly touched from the outside of the sound absorbing system.

The above configuration of the sound absorbing system allows sounds radiated from the fans 3a and 3b to collide with and be absorbed by the sound absorbers 5. Moreover, the sounds are attenuated before flowing into the airflow path 7 because part of the sounds is reflected toward the space 9 with the rest flowing into the airflow path 7.

In addition, the narrow portion of the airflow path 7 can block and absorb the sounds passing through the airflow path 7, resulting in attenuation of sounds radiated outward.

Further, the outermost width 30b (wide portion) of the airflow path 7 makes it possible to discharge (or draw in) air while reducing its flow rate when the air passes through the airflow path 7. As a result, air pressure loss can be prevented, and the cooling performance of the disk array 20 can be improved.

Furthermore, the innermost width 30a (wide portion) of the airflow path 7 makes it possible to discharge (or draw in) air while reducing its flow rate when the air passes through the airflow path 7. As a result, air pressure loss can be prevented, and the cooling performance of the disk array 20 can be improved.

Embodiment 11

Figure 17:
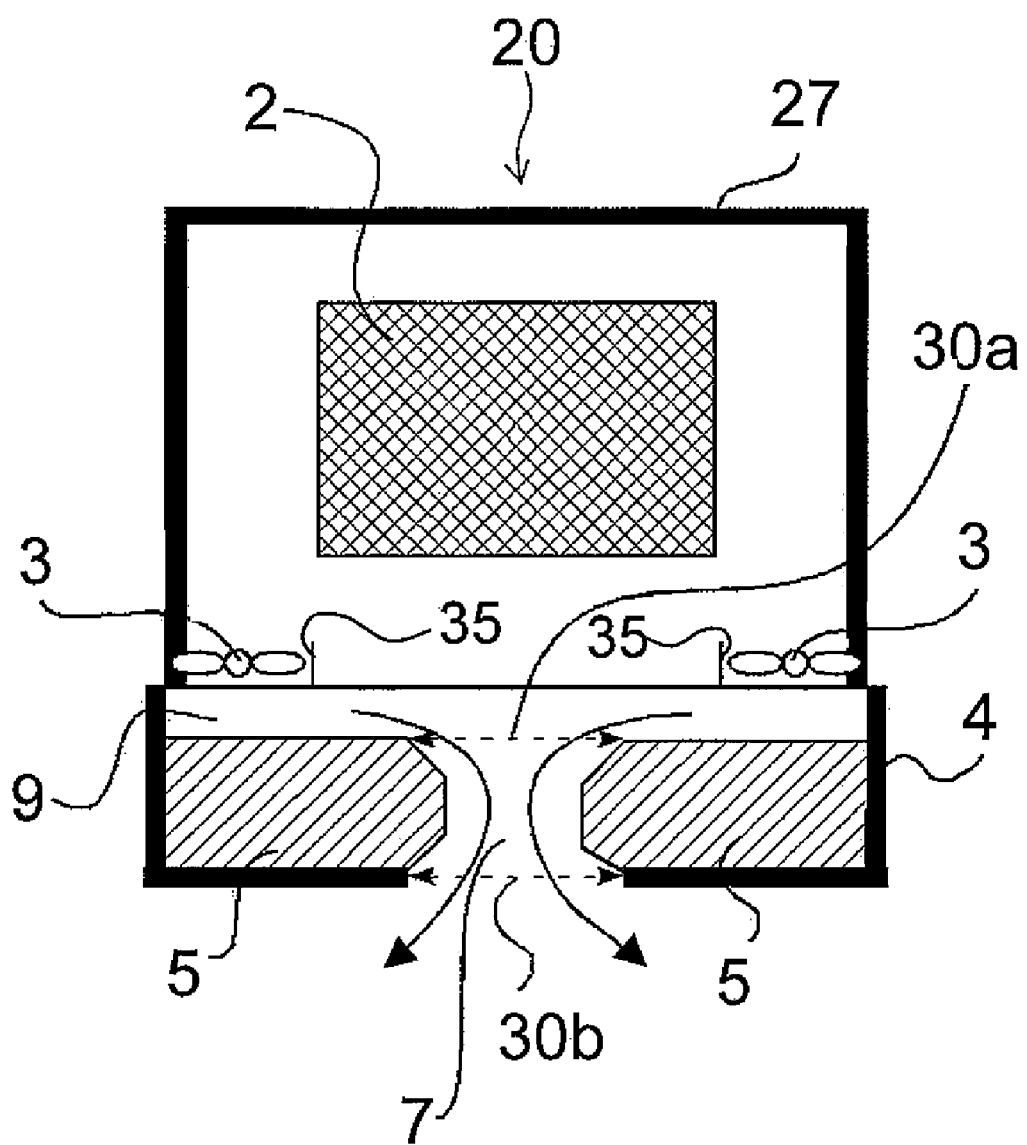
FIG. 17 is a diagram illustrating Embodiment 11 of the invention.

FIG. 17 is a cross-sectional top view illustrating the configuration of Embodiment 11 of the invention. In Embodiment 11, the portions of the two sound absorbers 5 that form the airflow path 7 are substantially trapezoidal in horizontal cross-section, which is the only difference from Embodiment 10. The shapes of those portions can also be polygons with more than four vertices. The other structures of Embodiment 11 are the same as those of Embodiment 10 shown in FIG. 16 and will not be discussed further.

The above configuration of the sound absorbing system allows sounds radiated from the fans 3 to collide with and be absorbed by the sound absorbers 5. Moreover, the sounds are attenuated before flowing into the airflow path 7 because part of the sounds is reflected toward the space 9 with the rest flowing into the airflow path 7.

In addition, as illustrated in FIG. 17, the narrow portion of the airflow path 7 can block and absorb the sounds passing through the airflow path 7, resulting in attenuation of sounds radiated outward. Because the portions of the two sound absorbers 5 that form the airflow path 7 are streamlined compared with those of Embodiment 10, the flow rate of air can be increased as well, which contributes to an improvement in cooling performance.

Further, the outermost width 30b (wide portion) of the airflow path 7 makes it possible to discharge (or draw in) air while reducing its flow rate when the air passes through the airflow path 7. As a result, air pressure loss can be prevented, and the cooling performance of the disk array 20 can be improved.

Furthermore, the innermost width 30a (wide portion) of the airflow path 7 makes it possible to discharge (or draw in) air while reducing its flow rate when the air passes through the airflow path 7. As a result, air pressure loss can be prevented, and the cooling performance of the disk array 20 can be improved.

Embodiment 12

Figure 18:
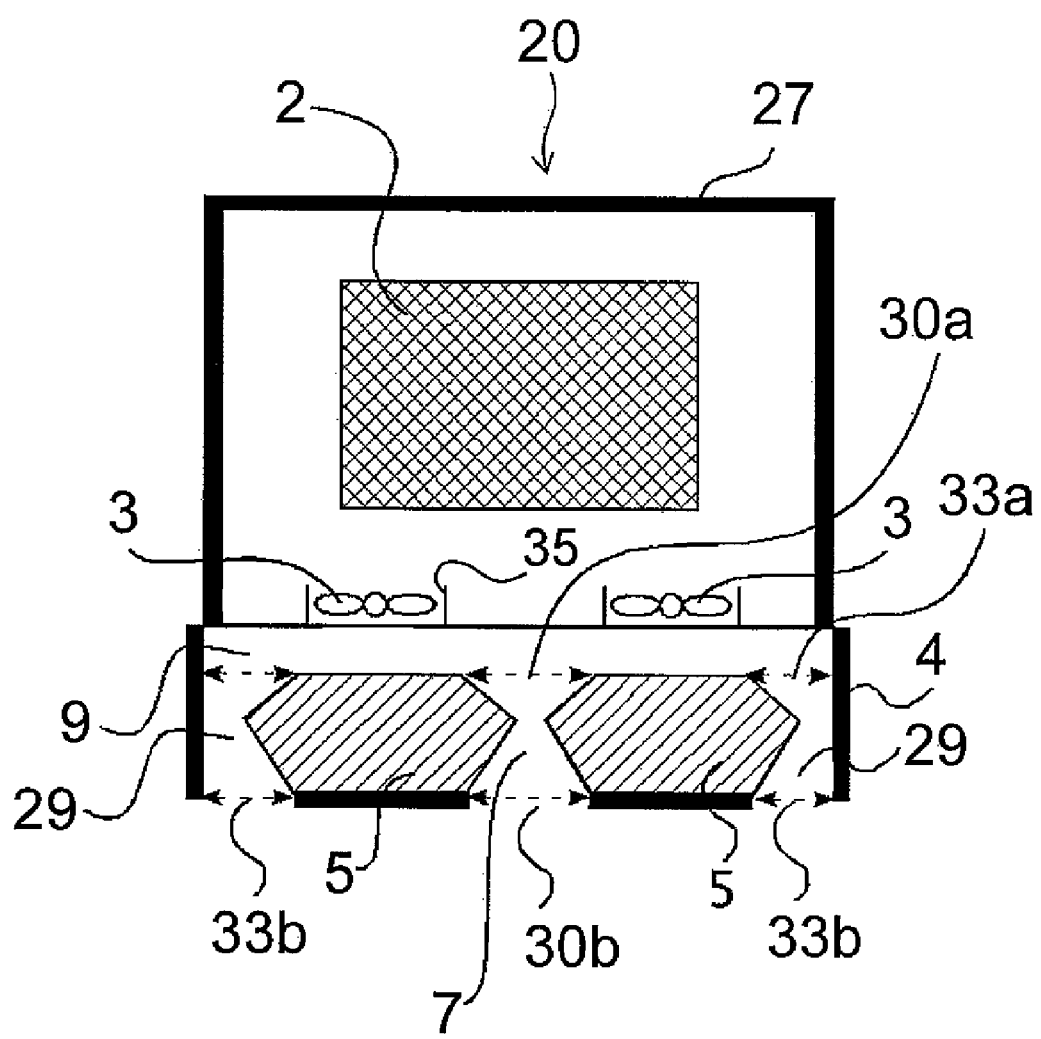
FIG. 18 is a diagram illustrating Embodiment 12 of the invention.

FIG. 18 is a cross-sectional top view illustrating the configuration of Embodiment 12 of the invention. The disk array 20 of FIG. 18 has the recording medium 2 installed inside its housing 27 and has the multiple fans 3 installed at a front section of the housing 27. The fans 3 are intended to cool the recording medium 2. In Embodiment 12, the installation positions of the fans 3 are closer to the center of the front surface of the housing 27 than those in the other embodiments.

The frame 4 houses a sound absorbing system including two of the sound absorbers 5. The sound absorbers 5 are arranged inside the frame 4 such that the sound absorbers 5 face the air outlet ports 35 of the fans 3. The sound absorbers 5 are each made of sound absorbing materials such as glass wool, urethane foam, and the like. In the space between the two sound absorbers 5, an airflow path 7 through which air passes from the fans 3 is provided. In addition, the space between the left-side wall of the frame 4 and the left-side sound absorber 5 and the space between the right-side wall of the frame 4 and the right-side sound absorber 5 each act as an airflow path 29. Thus, Embodiment 12 shown in FIG. 18 includes three airflow paths in total inside the frame 4 (i.e., the airflow path 7 and the two airflow paths 29). It should be noted that the frame 4 can instead include more than four airflow paths or include only the two airflow paths 29 without the airflow path 7 as long as the cooling performance of the disk array 20 can be maintained.

Similar to Embodiment 10, the sound absorbers 5 are arranged and shaped such that the fans 3 cannot be seen through any of the airflow path 7 and the airflow paths 29 from the outside of the sound absorbing system. Similar to the airflow path 7 of Embodiment 10, the width of each of the airflow paths 29 becomes smaller, the smallest, and then larger in a direction from the outside of the frame 4 to the inside of the disk array 20. The other structures of Embodiment 12 are the same as those of Embodiment 10 and will not be discussed further.

The above configuration of the sound absorbing system allows sounds radiated from the fans 3 to collide with and be absorbed by the sound absorbers 5. Further, the sounds are attenuated before flowing into the airflow path 7 and the airflow paths 29 because part of the sounds is reflected toward the space 9 with the rest flowing into the airflow path 7 and the airflow paths 29.

In addition, the narrow portions of the airflow path 7 and the airflow paths 29 can block and absorb the sounds passing therethrough, resulting in attenuation of sounds radiated outward.

Further, the outermost width 30b (wide portion) of the airflow path 7 and the outermost widths 33b (wide portions) of the airflow paths 29 make it possible to discharge (or draw in) air while reducing its flow rate when the air passes through the airflow path 7 and the airflow paths 29. As a result, air pressure loss can be prevented, and the cooling performance of the disk array 20 can be improved.

Furthermore, the innermost width 30a (wide portion) of the airflow path 7 and the innermost widths 33a (wide portions) of the airflow paths 29 make it possible to discharge (or draw in) air while reducing its flow rate when the air passes through the airflow path 7 and the airflow paths 29. As a result, air pressure loss can be prevented, and the cooling performance of the disk array 20 can be improved.

Embodiment 13

Figure 19:
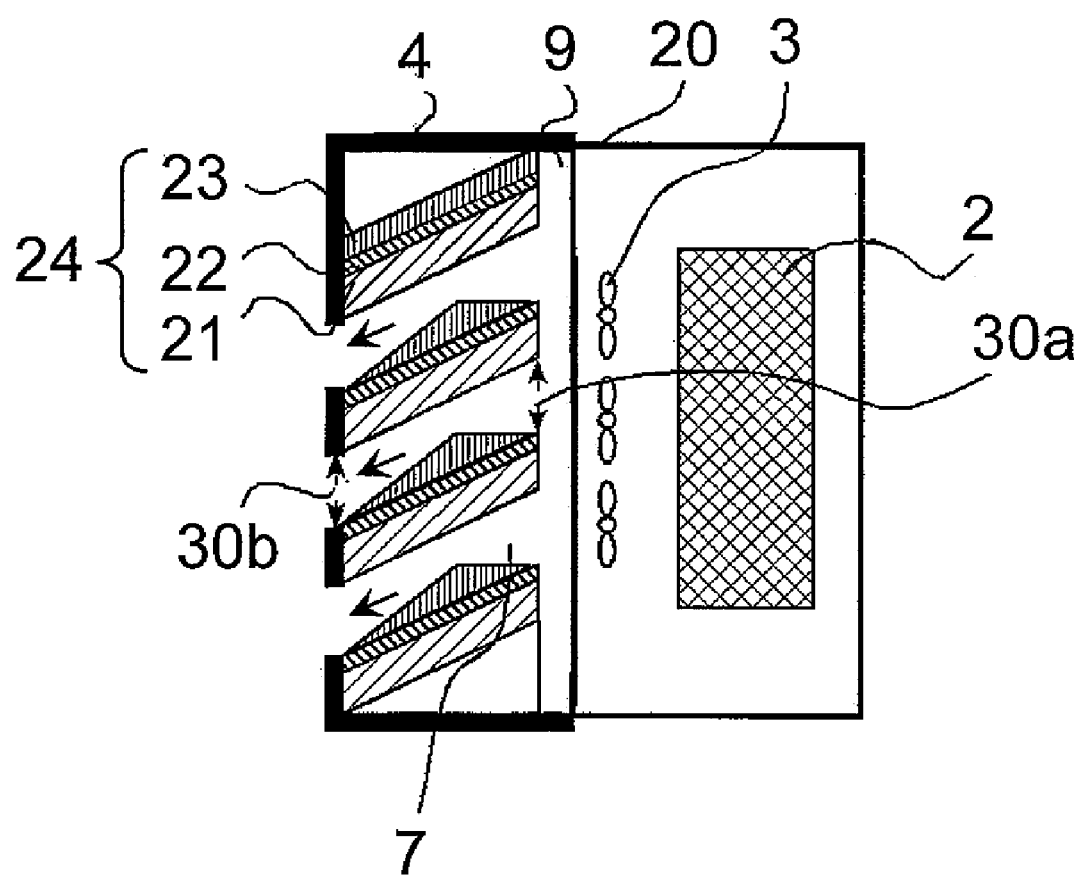
FIG. 19 is a diagram illustrating Embodiment 13 of the invention.

FIG. 19 is a cross-sectional side view illustrating the configuration of Embodiment 13 of the invention. Embodiment 13 is the same as Embodiment 9 except that the vertical width of each of the airflow paths 7 of Embodiment 13 is changed. Specifically, the airflow paths 7 of Embodiment 13 are shaped such that their innermost vertical widths 30a and outermost vertical widths 30b are larger than those of their other portions. In other words, the top face of each of the sound absorbers 24 that constitutes the bottom face of each of the airflow paths 7 is triangular in vertical cross-section, as illustrated in FIG. 19. Similar to Embodiment 10, the sound absorbers 24 can instead be formed such that the corners of those triangles are rounded or curved. In addition, those top faces of the sound absorbers 24 can instead be substantially trapezoidal in vertical cross-section, as in Embodiment 11. While the airflow-path-7-side face of the sound absorbing material 23 of each of the sound absorbers 24 is triangular in vertical cross-section as illustrated in FIG. 19, the airflow-path-7-side face of the sound absorbing material 21 of each of the sound absorbers 24 can also be triangular in vertical cross-section. In other words, the top and bottom faces of each of the airflow paths 7 can be triangular in vertical cross-section. The other structures of Embodiment 13 are the same as those of Embodiment 9 and will not be discussed further.

The above configuration of the sound absorbing system allows sounds radiated from the fans 3 to collide with and be absorbed by the sound absorbers 24. Further, the sounds are attenuated before flowing into the airflow paths 7 because part of the sounds is reflected toward the space 9 with the rest flowing into the airflow paths 7.

In addition, the narrow portions of the airflow paths 7 can block and absorb the sounds passing through the airflow paths 7, resulting in attenuation of sounds radiated outward.

Further, the outermost width 30b (wide portion) of each of the airflow paths 7 makes it possible to discharge (or draw in) air while reducing its flow rate when the air passes through the airflow paths 7. As a result, air pressure loss can be prevented, and the cooling performance of the disk array 20 can be improved.

Furthermore, the innermost width 30a (wide portion) of each of the airflow paths 7 makes it possible to discharge (or draw in) air while reducing its flow rate when the air passes through the airflow paths 7. As a result, air pressure loss can be prevented, and the cooling performance of the disk array 20 can be improved.

Embodiment 14

Figure 20:
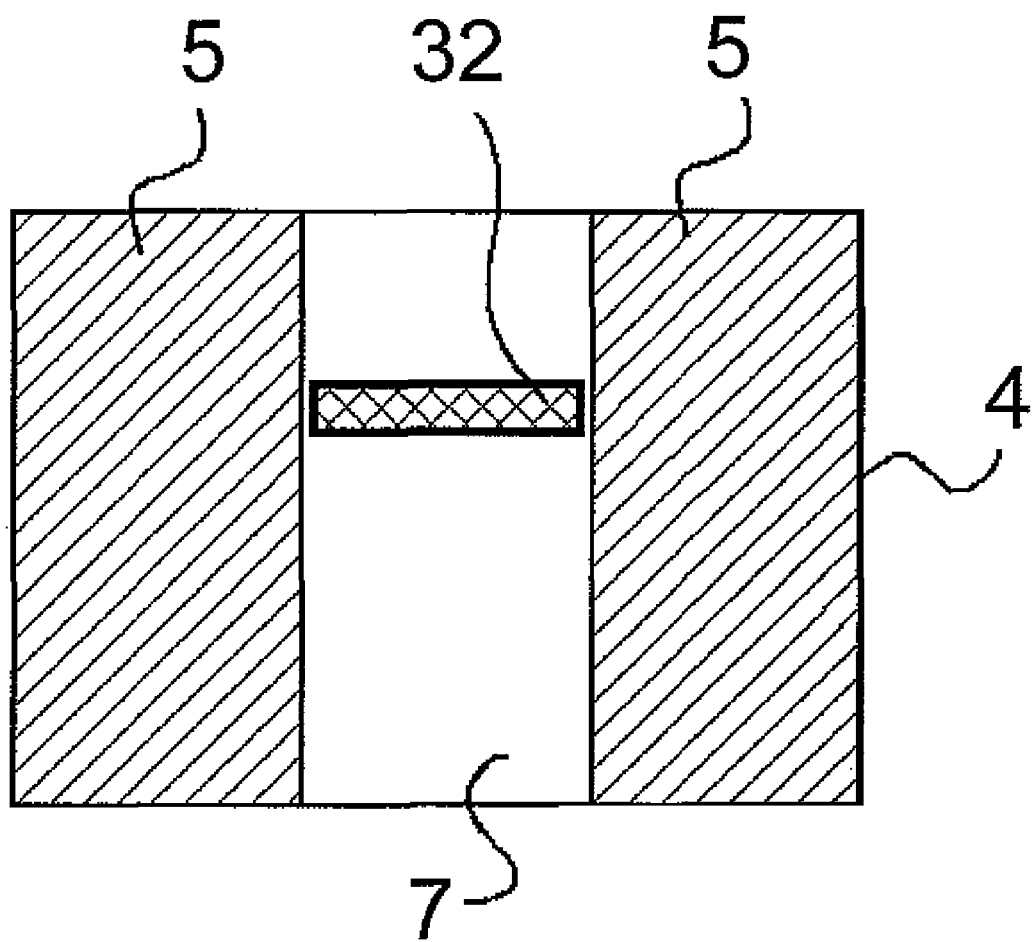
FIG. 20 is a front view illustrating Embodiment 14 of the invention.
Figure 21:
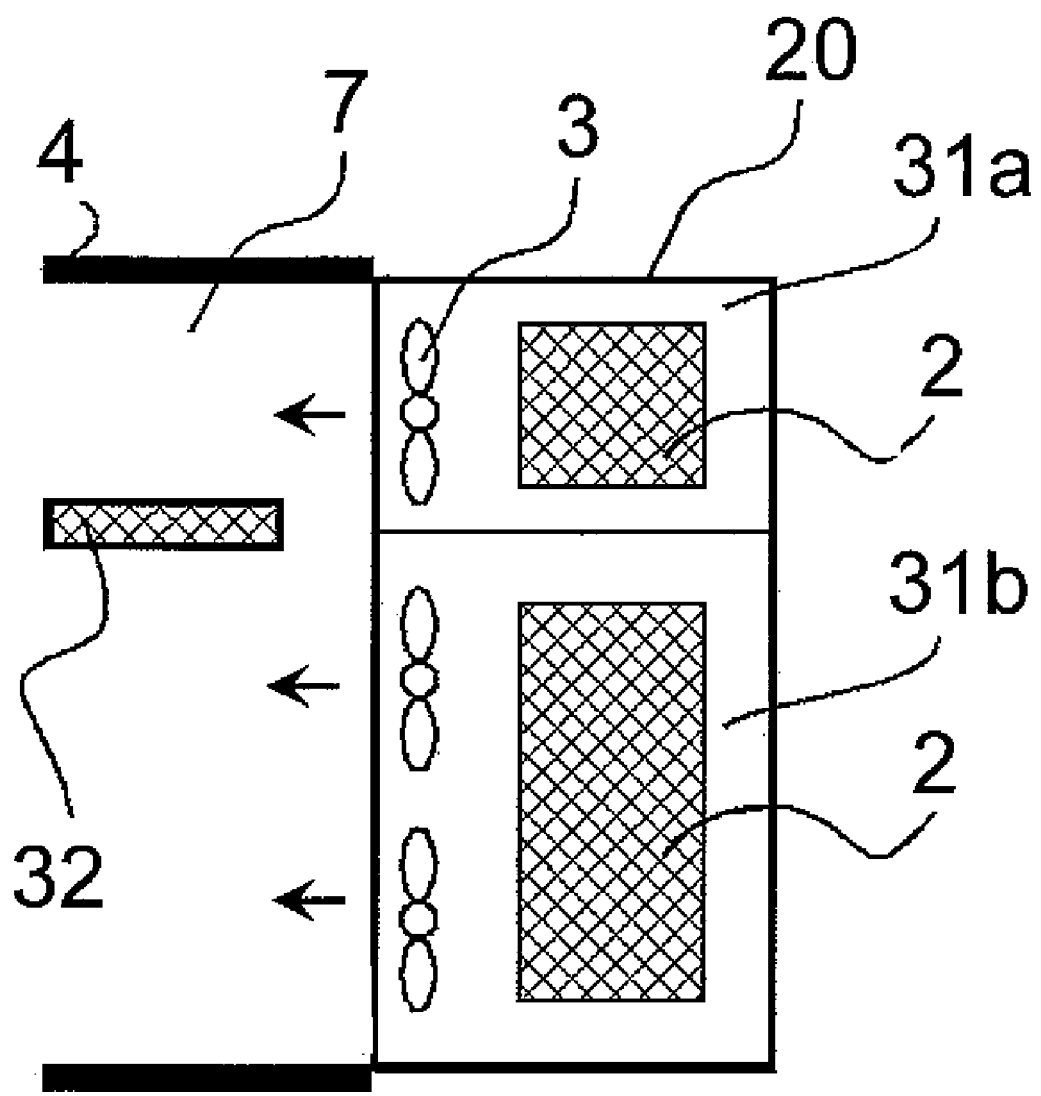
FIG. 21 is a cross-sectional side view illustrating Embodiment 14.

FIG. 20 is a front view of a sound absorbing system according to Embodiment 14, and FIG. 21 is a cross-sectional side view of a disk array to which the sound absorbing system is attached.

The frame 4 houses the sound absorbing system comprising two of the sound absorbers 5. As in Embodiment 1, the sound absorbers 5 are arranged inside the frame 4 such that the sound absorbers 5 prevent the fans 3 from being seen from the outside of the sound absorbing system. The sound absorbers 5 are each made of sound absorbing materials such as glass wool, urethane foam, and the like. The sound absorbers 5 can also be made by stacking together multiple sound absorbing materials as in Embodiment 2. In the space between the two sound absorbers 5, two airflow paths 7 through which air passes from the fans 3 are provided. As in Embodiment 10, the outermost and innermost widths of the airflow paths 7 can be larger than the widths of their other portions.

As illustrated in FIG. 21, the disk array 20 of Embodiment 14 comprises two housings 31a and 31b that are vertically stacked together. Further, the frame 4 houses a partition board 32 which is fixed at the height that corresponds to the boundary between the housings 31a and 31b. Thus, the two airflow paths 7 are partitioned by the partition board 32 into an airflow path that communicates with the housing 31a and an airflow path that communicates with the housing 31b.

Methods for fixing the partition board 32 inside the frame 4 include connecting the partition board 32 to the disk array 20 (in this case, the partition board 32 is part of the disk array 20) and connecting the partition board 32 to the frame 4. In terms of noise reduction, it is desired that the partition board 32 be made of sound absorbing materials such as glass wool, urethane foam, and the like. The other structures of Embodiment 14 are the same as those of Embodiment 1 and will not be discussed further.

When the disk array 20 comprises multiple housings as above, the recording media 2, each of which is housed by one of the housings, may need to be cooled under different conditions based on structural differences between the housings. For example, the recording media 2 may need to be cooled by rotating fans of the same type at different rotational speeds. In such cases, an unstable air flow is likely to occur when air streams flowing from the housings (or air streams flowing toward the housings) merge, which may result in a decrease in the cooling performance of the disk array 20. To overcome such problems, therefore, the sound absorbing system of Embodiment 14 includes the partition board 32. The presence of the partition board 32 between the airflow paths 7 prevents such an unstable air flow and its associated air pressure loss even when the disk array 20 comprises multiple housings. Thus, the cooling performance of the disk array 20 is higher than when the disk array 20 is without the partition board 32.

Figure 22:
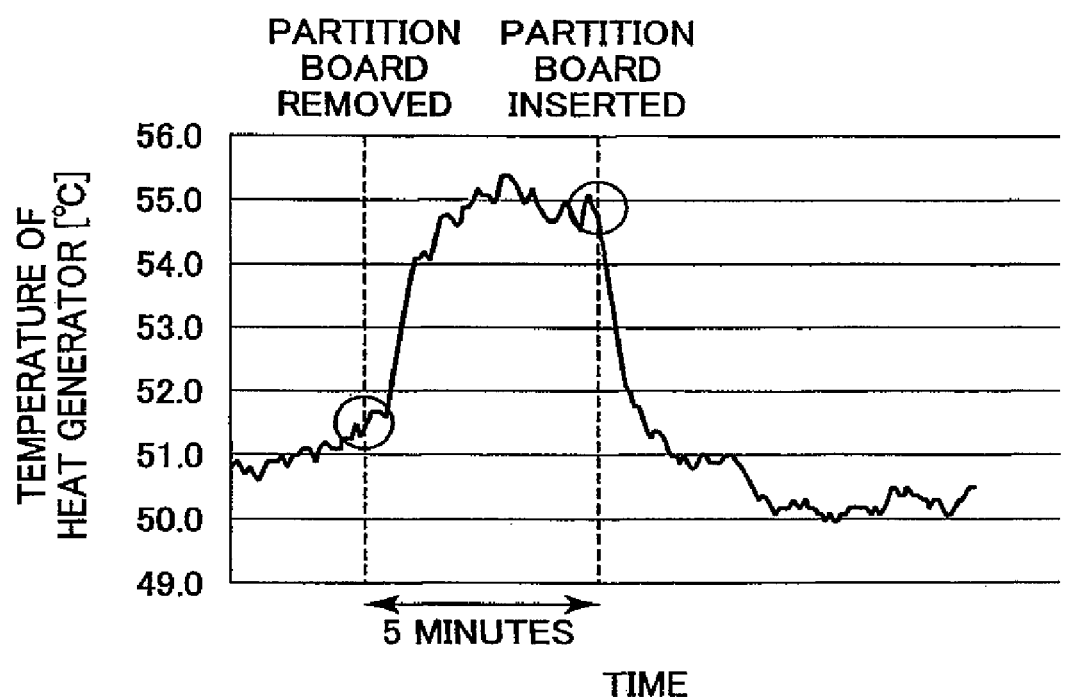
FIG. 22 is a graph showing measured temperatures of a heat-generating element inside the disk array of Embodiment 14.

FIG. 22 is a graph showing measured temperatures of a heat-generating element inside the disk array 20 of Embodiment 14.

In FIG. 22, the horizontal axis represents time, and the vertical axis represents the temperature of the heat-generating element. The measurement was done by attaching a thermocouple to one of the recording media 2 which is the heat-generating element. The two dashed lines of FIG. 22 represent the time at which the partition board 32 was removed and the time at which the partitions board 32 was inserted. The heat-generating element was placed in the middle of a housing of the disk array 20 when viewed from the top of the housing.

FIG. 22 reveals that the temperature of the heat-generating element decreased after the insertion of the partition board 32. This means that the partition board 32 can improve the cooling performance of the disk array 20. The sound absorbing system of Embodiment 14, which includes the same sound absorbers 5 as those of Embodiment 1, allows sounds radiated from the fans 3 to collide with and be absorbed by the sound absorbers 5. Moreover, the sounds are attenuated before flowing into the airflow paths 7 because part of the sounds is reflected toward the space 9 with the rest flowing into the airflow paths 7. When the partition board 32 is made of sound absorbing materials, the noise of the disk array 20 can be reduced further because more of the sounds flowing through the airflow paths 7 collide with and are absorbed by the partition board 32.

While Embodiment 14 is based on the assumption that the disk array 20 comprises two housings which are vertically stacked together, the disk array 20 can instead comprise multiple housings which are arranged horizontally.

Further, each of the above-described embodiments is based on the assumption that the fans 3 discharge the air inside the housing 27 through the air outlet ports 35. However, the invention is also applicable when the fans 3 draw in external air into the housing 27 through the air outlet ports 35. In that case as well, the above-described advantages of the invention can be derived.

What is claimed is:

1. A sound absorbing system for an electronic device, the device having a housing that houses a recording medium and at least one fan to cool the recording medium and has a ventilation hole through which air discharged or drawn in by the at least one fan passes, the system comprising:
    a frame attached to the housing;
    a sound absorber arranged within the frame so as to face the ventilation hole;
    an airflow path formed in the sound absorber, the airflow path having an opening through which air discharged from the ventilation hole or air drawn in toward the ventilation hole passes; and
    an acoustic board arranged in the airflow path, the acoustic board being arranged in a slanted manner with respect to the inner side faces of the airflow path or having curved surfaces,
    wherein the opening communicates the airflow path with the outside of the frame,
    the opening and the ventilation hole are arranged in a discharging or suctioning direction of the fan, and
    the airflow path is formed such that a straight line that passes through the airflow path from the opening toward the housing does not pass through the ventilation hole but is intercepted by a portion of the housing.

2. The sound absorbing system of claim 1, wherein a space exists between the sound absorber and the face of the housing through which the ventilation hole is formed and wherein the space communicates with the airflow path so that the air discharged from the ventilation hole passes through the opening, the sound absorbing system further comprising a concave and convex portion on a surface of the sound absorber, the surface facing the space existing between the sound absorber and the housing.

3. The sound absorbing system of claim 1, wherein the sound absorber and the acoustic board jointly are housed within the frame, the frame being connected to the housing of the electronic device in a rotatable manner.

4. A sound absorbing system for an electronic device, the device having a housing that houses a recording medium and at least one fan to cool the recording medium and has a air outlet port from which air is discharged by the at least one fan toward the outside of the housing, the system comprising:
    a frame attached to the housing;
    a sound absorber arranged within the frame so as to face the air outlet port;
    an airflow path formed in the sound absorber, the airflow path having an opening through which the air discharged from the air outlet port passes toward the outside of the opening; and
    an acoustic board arranged in the airflow path, the acoustic board being arranged in a slanted manner with respect to the inner side faces of the airflow path or having curved surfaces,
    wherein the opening communicates the airflow path with the outside of the frame,
    the opening and the ventilation hole are arranged in a discharging direction of the fan, and
    the airflow path is formed such that a straight line that passes through the airflow path from the opening toward the housing does not pass through the air outlet port but is intercepted by a portion of the housing.

* * * * *